(12) United States Patent
Sebe et al.

(10) Patent No.: US 7,732,839 B2
(45) Date of Patent: Jun. 8, 2010

(54) SEMICONDUCTOR DEVICE AND METHOD FOR FABRICATING THE SAME

(75) Inventors: Akio Sebe, Osaka (JP); Naoki Kotani, Hyogo (JP); Shinji Takeoka, Osaka (JP); Gen Okazaki, Hyogo (JP); Junji Hirase, Osaka (JP); Kazuhiko Aida, Chiba (JP)

(73) Assignee: Panasonic Corporation, Osaka (JP)

( * ) Notice: Subject to any disclaimer, the term of this patent is extended or adjusted under 35 U.S.C. 154(b) by 692 days.

(21) Appl. No.: 11/525,011

(22) Filed: Sep. 22, 2006

(65) Prior Publication Data

US 2007/0090395 A1    Apr. 26, 2007

(30) Foreign Application Priority Data

Oct. 26, 2005    (JP) .............................. 2005-311060

(51) Int. Cl.
*H01L 27/10*    (2006.01)
(52) U.S. Cl. ............... 257/206; 438/197; 257/E27.062; 257/E31.085
(58) Field of Classification Search .................. 257/204, 257/351, 206, 412, E27.062, E31.085; 438/188, 438/199, 902, 197
See application file for complete search history.

(56) References Cited

U.S. PATENT DOCUMENTS 6,521,540 B1    2/2003    Li
7,202,120 B2 *    4/2007    Shima et al. ................. 438/153
2003/0040158 A1    2/2003    Saitoh
2006/0006420 A1 *    1/2006    Goto ........................... 257/204

FOREIGN PATENT DOCUMENTS

| JP | 08-274187 | 10/1996 |
| JP | 2003-60076 | 2/2003 |
| JP | 2003-273240 A | 9/2003 |
| JP | 2006-24784 | 1/2006 |

OTHER PUBLICATIONS

S. Pidin et al., "CMOS Architecture using Tensile and Compressive Nitride Films", Semiconductor/Integrated Circuit Technology 68th Symposium Lecture Memoir, Jun. 23-24, 2005, Kyoto, Japan.
Japanese Office Action, with English translation, issued in Japanese Patent Application No. 2006-171069, dated Mar. 2, 2010.

* cited by examiner

*Primary Examiner*—Quoc D Hoang
(74) *Attorney, Agent, or Firm*—McDermott Will & Emery LLP

(57) ABSTRACT

A MIS transistor includes a gate electrode portion, insulating sidewalls formed on side surfaces of the gate electrode portion, source/drain regions and a stress film formed so as to cover the gate electrode portion and the source/drain regions. A height of an upper surface of the gate electrode portion is smaller than a height of an upper edge of each of the insulating sidewalls. A thickness of first part of the stress film located on the gate electrode portion is larger than a thickness of second part of the stress film located on the source/drain regions.

19 Claims, 17 Drawing Sheets

←Nch MISFET→←Pch MISFET→

←Nch MISFET→←Pch MISFET→

SEMICONDUCTOR DEVICE AND METHOD FOR FABRICATING THE SAME

BACKGROUND OF THE INVENTION

1 Field of the Invention

The present invention relates to a semiconductor device and a method for fabricating the semiconductor device, and more particularly relates to an effective technique in application to a semiconductor device including a MISFET having a sidewall structure and a method for fabricating the semiconductor device.

2. Description of Prior Art

As a field-effect transistor mounted in a semiconductor device, an insulating gate type field-effect transistor called MISFET (metal insulator semiconductor field-effect transistor) has been known. This type of MISFETs is characterized in that the degree of integration can be easily increased, and therefore has been widely used as a circuit element constituting an integrated circuit to contribute to acceleration recent reduction in device size. However, with reduction in device size, different kinds of problems regarding MISFETs have come to the surface. One of the problems is stress applied to a channel formation region in a MISFET. In an ultra-fine CMIS (complementary MIS) process with a gate length of 0.1 μm or less, device temperature has been reduced more and more for the purpose of introduction of new materials, suppression of a short channel effect in MISFETs and the like. With a reduced temperature, a residual stress tends to remain in a device. A residual stress resulting from process is applied to a surface layer portion in an active region of a semiconductor substrate, i.e., a channel formation region of a MISFET.

As for change in transistor characteristics with respect to a stress applied to a channel formation region, when a stress is applied in the same direction as the direction (gate length direction) in which a drain current (Id) flows, the followings have been known.

(1) A drain current of an n-channel MISFET (which will be herein referred to as an "nMISFET") is reduced due to a compressive stress and is increased due to a tensile stress.

(2) A drain current of a p-channel MISFET (which will be herein referred to as a "pMISFET") is increased due to a compressive stress and is reduced due to a tensile stress.

Therefore, in recent years, techniques for intentionally utilizing a stress applied to a channel formation region to improve a driving power of a transistor have drawn attention.

For example, there has been proposed a method in which after formation of MISFETs, as silicon nitride films for a self aligning contact which also serve as interlevel insulating films (and which will be hereafter referred to as "liner nitride films"), a nitride film (tensile stress film) 107 for generating a tensile stress in a channel formation region is selectively formed, as shown in FIG. 17A, in an nMISFET region and a nitride film (compressive stress film) 108 for generating a compressive stress in a channel formation region is selectively formed, as shown in FIG. 17B, in a pMISFET, so that a driving power of each of the MISFETs is improved (see Non-patent reference 1). In each of FIGS. 17A and 17B, 100 denotes a semiconductor substrate, 101 denotes a gate insulating film, 102 denotes a gate electrode, 103 denotes an extension region, 104 denotes insulating sidewalls, 105 denotes source/drain regions, and 106 denotes a silicide layer. As shown in FIGS. 17A and 17B, the tensile stress film 107 itself shrinks and the compressive stress film 108 itself expands.

It has been known that the larger a thickness of each of a tensile stress film and a compressive stress film is, the larger a stress generated in a channel region becomes. Therefore, a tensile stress film having an increased thickness and a compressive stress film having an increased thickness can improve respective driving powers of an nMISFET and a pMISFET.

(Patent Reference 1)
Japanese Laid-Open Publication No. 2003-273240
(Non-Patent Reference 1)
S. Pidin, et al., CMOS Architecture using Tensile and Compressive Nitride Films, Semiconductor/Integrated Circuit Technology 68$^{th}$ Symposium Lecture Memoir, pp. 19-22, 2005

SUMMARY OF THE INVENTION

However, in a known semiconductor device using a liner nitride film serving as a stress film or according to a method for fabricating the semiconductor device, when a liner nitride film is deposited so as to have a large thickness for the purpose of improving driving powers of MISFETs, the following problems arise.

FIGS. 18A through 18D are cross-sectional views illustrating respective steps for fabricating a known semiconductor device.

As shown in FIG. 18A, gate electrodes 203 are formed on a semiconductor substrate 200 in which a well region 201 is defined with a gate insulating film 202 interposed between each of the gate electrodes 203 and the well region 201. Next, extension regions 204 are formed on both sides of each of the gate electrodes 203 in the well region 201 and then insulating sidewalls 210 are formed on side surfaces of each of the gate electrodes 203, respectively. Thereafter, source/drain regions 205 are formed so that each of the source/drain regions 205 is provided in part of the well region 201 located at a side of an associated one of the insulating sidewalls 210 and has a junction with the well region 201 at a deeper location than a junction between each of the extension regions 204 and the well region 201. Subsequently, a silicide layer 206 is formed on respective upper surfaces of the gate electrodes 203 and source/drain regions 205. Then, a liner nitride film 207 is deposited to a large thickness so as to cover the gate electrodes 203 and the insulating sidewalls 210. For example, the thickness of the liner nitride film 207 corresponds to a distance equal to or larger than half of a distance between adjacent two of the insulating sidewalls 210 which are located between adjacent two of the gate electrodes 203.

Next, as shown in FIG. 18B, an interlevel insulating film 208 is deposited over the liner nitride film 207. Subsequently, holes for obtaining electrical contacts with the source/drain regions 205 are formed in the interlevel insulating film 208 and liner nitride film 207. Specifically, as shown in FIG. 18C, holes 209 are formed in the interlevel insulating film 208 so as to reach the liner nitride film 207. Next, as shown in FIG. 18D, parts of the liner nitride film 207 located under the holes 209 are removed so that the holes 209 reach the silicide layer 206 on the upper surfaces of the source/drain regions 205.

However, in the known technique, when the thickness of the liner nitride film 207 is large, specifically, when the distance between adjacent two of the gate electrodes 203 is small and, as shown in FIG. 18A, a thickness of part of the liner nitride film 207 located on each of the source/drain regions 205 between adjacent two of gate electrodes 203 is larger than a deposition thickness, etching of the liner nitride film 207 for forming the holes 209 is terminated before completion of the etching, so that opening failure in forming the holes 209 is caused, as shown in FIG. 18D. That is, contact failure which is failure to obtain electrical connection with the source/drain regions 205 is caused.

In view of the above-described problems, it is therefore an object of the present invention is to improve a driving power of a MISFET by effectively applying stress to a channel formation region using a stress film while preventing contact failure.

To achieve the above-described object, the present inventors have reached the present invention that a height of a gate electrode portion of a field-effect transistor is set to be lower than a height of an upper edge of insulating sidewalls formed on side surfaces of the gate electrode portion, thereby increasing, in a self aligning manner, a thickness of a stress film formed on the gate electrode portion to a larger thickness than a deposition thickness. Thus, a stress applied to a channel formation region can be effectively increased, compared to a known semiconductor device using a stress film having the same deposition thickness. That is, a driving power of a MISFET can be improved by increasing a drain current while a deposition thickness of a stress film is controlled to be a thickness with which contact failure is prevented.

Specifically, a semiconductor device according to the present invention includes a first MIS transistor of a first conductive type formed in a first region in a semiconductor substrate. In the semiconductor device, the first MIS transistor includes a first gate insulating film formed on the first region, a first gate electrode portion formed on the first gate insulating film, first insulating sidewalls formed on side surfaces of the first gate electrode portion, first source/drain regions, each being formed in part of the first region located at a side of an associated one of the first insulating sidewalls, and a first stress film formed so as to cover the first gate electrode portion and the first source/drain regions, a height of an upper surface of the first gate electrode portion is lower than a height of an upper edge of each of the first insulating sidewalls, and a thickness of first part of the first stress film located on the first gate electrode portion is larger than a thickness of second part of the first stress film located on the first source/drain regions.

In the semiconductor device of the present invention, the first gate electrode portion may include a first gate electrode formed of silicon on the first gate insulating film and a first silicide layer formed on the first gate electrode.

In the semiconductor device of the present invention, the first MIS transistor may be an n-channel MIS transistor, and the first stress film may be a tensile stress film for generating a tensile stress in a channel region of the first region located under the first gate electrode portion.

In the semiconductor device of the present invention, the first MIS transistor may be a p-channel MIS transistor, and the first stress film may be a compressive stress film for generating a compressive stress in a channel region of the first region located under the first gate electrode portion.

The semiconductor device of the present invention may further include a second MIS transistor of a second conductivity type formed on a second region in the semiconductor substrate. In the semiconductor device, the second MIS transistor may include a second gate insulating film formed on the second region, a second gate electrode portion formed on the second insulating film, second insulating sidewalls formed on side surfaces of the second gate electrode portion, second source/drain regions, each being formed in part of the second region located at a side of an associated one of the second insulating sidewalls, and a second stress film formed so as to cover the second gate electrode portion and the second source/drain regions.

When the semiconductor device of the present invention further includes the second MIS transistor of the second conductive type, a height of an upper surface of the second gate electrode portion may be lower than a height of an upper edge of each of the second insulating sidewalls, and a thickness of third part of the second stress film located on the second gate electrode portion may be larger than a thickness of fourth part of the second stress film located on the second source/drain regions.

When the semiconductor device of the present invention further includes the second MIS transistor of the second conductive type, the first MIS transistor may be an n-channel MIS transistor, the second MIS transistor may be a p-channel MIS transistor, the first stress film may be a tensile stress film for generating a tensile stress in a channel region of the first region located under the first gate electrode portion, and the second stress film may be formed of the tensile stress film forming the first stress film.

When the semiconductor device of the present invention further includes the second MIS transistor of the second conductive type, the first MIS transistor may be a p-channel MIS transistor, the second MIS transistor may be an n-channel MIS transistor, the first stress film may be a compressive stress film for generating a compressive stress in a channel region of the first region located under the first gate electrode portion, and the second stress film may be formed of the compressive stress film forming the first stress film.

When the semiconductor device of the present invention further includes the second MIS transistor of the second conductive type, the first MIS transistor may be an n-channel MIS transistor, the second MIS transistor may be a p-channel MIS transistor, the first stress film may be a tensile stress film for generating a tensile stress in a channel region of the first region located under the first gate electrode portion, and the second stress film may be a compressive stress film for generating a compressive stress in a channel region of the second region located under the second gate electrode portion.

When the semiconductor device of the present invention further includes the second MIS transistor of the second conductive type, the second gate electrode portion may include a second gate electrode formed of silicon on the second gate insulating film and a second silicide layer formed on the second gate electrode.

When the semiconductor device of the present invention further includes the second MIS transistor of the second conductive type, a height of an upper surface of the second gate electrode portion may be equal to or larger than a height of an upper edge of each of the second insulating sidewalls, and a thickness of first part of the first stress film located on the first gate electrode portion may be larger than a thickness of third part of the second stress film located on the second gate electrode portion. In this case, a height of an upper edge of each of the first insulating sidewalls may be larger than the height of the upper edge of each of the second insulating sidewalls. Also, the first MIS transistor may be an n-channel MIS transistor, the second MIS transistor may be a p-channel MIS transistor, the first stress film may be a tensile stress film for generating a tensile stress in a channel region of the first region located under the first gate electrode portion, and the second stress film may be formed of the tensile stress film forming the first stress film. Moreover, the first MIS transistor may be a p-channel MIS transistor, the second MIS transistor may be an n-channel MIS transistor, the first stress film may be a compressive stress film for generating a compressive stress in a channel region of the first region located under the first gate electrode portion, and the second stress film may be formed of the compressive stress film forming the first stress film. The second gate electrode portion may include a second gate electrode formed of silicon on the second gate insulating film and a second silicide layer formed on the second gate electrode. A height of an upper edge of each of the first insulating sidewalls may be equal to the height of the upper edge of each of the second insulating sidewalls. In this case, the first MIS transistor may be an n-channel MIS transistor, the second MIS transistor may be a p-channel MIS transistor, the first stress film may be a tensile stress film for generating a tensile stress in a channel region of the first region located under the first gate electrode portion, and the second stress film may be formed of the tensile stress film forming the first stress film. As another option, the first MIS transistor may be a p-channel MIS transistor, the second MIS transistor may be an n-channel MIS transistor, the first stress film may be a compressive stress film for generating a compressive stress in a channel region of the first region located under the first gate electrode portion, and the second stress film may be formed of the compressive stress film forming the first stress film. Furthermore, the second gate electrode portion may include a second gate electrode formed of silicon on the second gate insulating film, a third gate electrode formed of a different conductive material from a material of the second electrode on the second gate electrode, and a third silicide layer formed on the third gate electrode. In this case, the third gate electrode may be formed of a SiGe film.

A method for fabricating a semiconductor device according to the present invention is a method for fabricating a semiconductor device which includes a first MIS transistor of a first conductive type formed in a first region in a semiconductor substrate. The method includes the steps of: a) forming a first gate insulating film on the first region; b) forming a conductive film and a gate height adjusting film in this order on the first gate insulating film; c) performing patterning to the gate height adjusting film and the conductive film to form a first gate electrode and a first gate height adjusting film pattern on the first gate insulating film; d) forming first insulating sidewalls on side surfaces of the first gate electrode and the first gate height adjusting film pattern; e) forming, after the step d), first source/drain regions so that each of the first source/drain regions is provided in part of the first region located at a side of an associated one of the first insulating sidewalls; f) removing, after the step of d), the first gate height adjusting film pattern to form a recess surrounded by upper portions of the first insulating sidewalls on the first gate electrode; and g) forming, after the step f), a first stress film so as to cover at least the first source/drain regions and a first gate electrode portion including the first gate electrode. In the method, in the step g), a height of an upper surface of the first gate electrode portion is smaller than a height of an upper edge of each of the first insulating sidewalls and a thickness of first part of the first stress film located on the first gate electrode potion is larger than second part of the first stress film located on the first source/drain regions.

The method for fabricating a semiconductor device according to the present invention may further include, between the step f) and the step g), the step h) of forming a first silicide layer on the first gate electrode. In the step g), the first gate electrode portion may include the first gate electrode and the first silicide layer and a height of an upper surface of the first silicide layer may be smaller than a height of an upper edge of each of the first insulating sidewalls.

In the method for fabricating a semiconductor device according to the present invention, the semiconductor device may further include a second MIS transistor of a second conductive type formed in a second region in the semiconductor substrate, the step a) may include the step of forming a second gate insulating film on the second region, the step b) may include the step of forming the conductive film and the gate height adjusting film in this order on the second gate insulating film, the step c) may include the step of performing patterning to the gate height adjusting film and the conductive film to from a second gate electrode and a second gate height adjusting film pattern on the second gate insulating film, the step d) may include the step of forming second insulating sidewalls on side surfaces of the second gate electrode and the second gate height adjusting film pattern, the step e) may include the step of forming second source/drain regions so that each of the second source/drain regions is provided in part of the second region located at a side of an associated one of the second insulating sidewalls, and the step g) may include the step of forming a second stress film so as to cover at least the second source/drain regions and a second gate electrode portion including the second gate electrode. In this case, the step of f) may include a step of removing the second gate height adjusting film pattern to form a recess surrounded by upper portions of the second insulating sidewalls on the second gate electrode, and in the step g), a height of an upper surface of the second gate electrode portion may be smaller than a height of an upper edge of each of the second insulating sidewalls and a thickness of second part of the second stress film located on the second gate electrode portion may be larger than a thickness of fourth part of the second stress film located on the second source/drain regions. Moreover, in the step g), the second gate electrode portion may include the second gate electrode, a third gate electrode formed on the second gate electrode and including the second gate height adjusting film pattern and a third silicide layer formed on the third gate electrode.

In the method for fabricating a semiconductor device according to the present invention, the semiconductor device may further include a second MIS transistor of a second conductive type formed in a second region in the semiconductor substrate, the step a) may include the step of forming a second gate insulating film on the second region, the step b) may include the step of forming the conductive film and the gate height adjusting film in this order on the second gate insulating film, the method may further include, between the step b) and the step c), the step h) of removing the gate height adjusting film on the second region, the step c) may include the step of performing patterning to the conductive film to form a second gate electrode on the second gate insulating film, the step d) may include the step of forming second insulating sidewalls on side surfaces of the second gate electrode, the step e) may include the step of forming second source/drain regions so that each of the second source/drain regions is provided in part of the second region located at a side of an associated one of the second insulating sidewalls, and the step g) may include the step of forming a second stress film so as to cover at least the second source/drain regions and a second gate electrode portion including the second gate electrode.

When the step g) includes the step of forming a second stress film so as to cover at least the second source/drain regions and a second gate electrode portion including the second gate electrode, in the step g), the second gate electrode portion may include the second gate electrode and a second silicide layer formed on the second gate electrode. When the second gate electrode portion includes the second gate electrode and a second silicide layer formed on the second gate electrode or when the second gate electrode portion includes the second gate electrode, a third gate electrode formed on the second gate electrode and including the second gate height adjusting film pattern and a third silicide layer formed on the third gate electrode, in the step g), the height of the upper surface of the second gate electrode portion may be equal to or larger than the height of each of the second insulating sidewalls, and the thickness of the first part of the first stress film located on the first gate electrode portion may be larger than a thickness of third part of the second stress film formed on the second gate electrode portion.

According to the present invention, only a thickness of a stress film formed on a gate electrode is selectively increased to a larger thickness than a deposition thickness. Thus, a stress applied in a channel region can be effectively increased, compared to a known semiconductor device using a stress film, when the same deposition thickness is used in both of the known and inventive semiconductor devices. Therefore, by increasing a drain current while a deposition thickness itself of the stress film is controlled to a thickness with which contact failure is prevented, a driving power of a MISFET can be improved, so that a high performance semiconductor device can be achieved.

As has been described, the present invention relates to semiconductor devices and methods for fabricating a semiconductor device. More particularly, when the present invention is applied to a semiconductor device including a MISFET having a sidewall structure and a method for fabricating such a semiconductor device, according to the present invention, a high performance semiconductor device can be achieved by improving a driving power of a MISFET while contact failure is prevented and the present invention is very useful.

DESCRIPTION OF THE PREFERRED EMBODIMENTS

First Embodiment

Hereafter, a semiconductor device according to a first embodiment of the present invention and a method for fabricating the semiconductor device will be described. Specifically, as an example of application of the first embodiment, a semiconductor device having complementary MISFETs with a minimum gate length of 0.1 µm or less will be described in detail with reference to the accompanying drawings.

Figure 1:
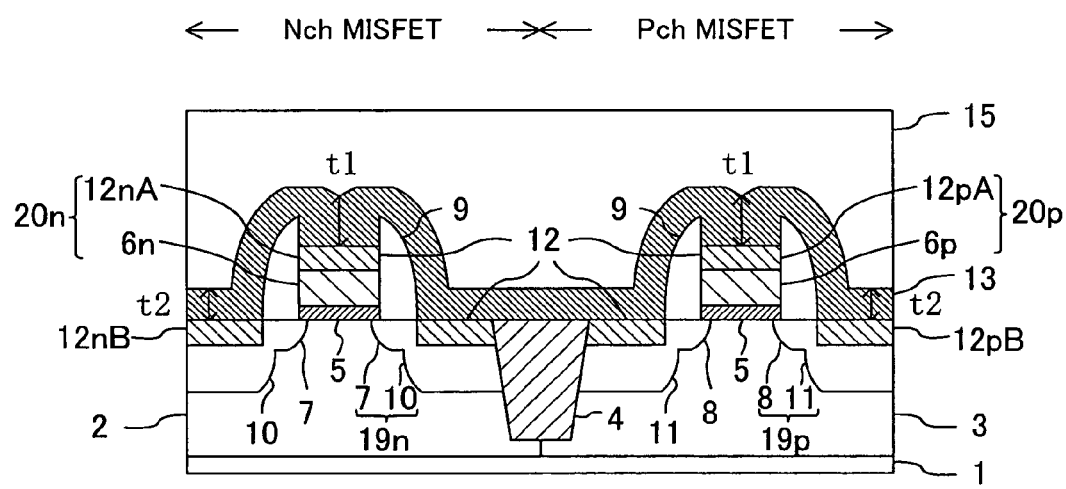
FIG. 1 is a cross-sectional view of a semiconductor device according to a first embodiment of the present invention.

FIG. 1 is a cross-sectional view illustrating a schematic structure of a semiconductor device according to the first embodiment.

As shown in FIG. 1, the semiconductor device of this embodiment is fabricated, for example, with a p-type semiconductor substrate 1 of single crystalline silicon as a main body. The p-type semiconductor substrate 1 includes a first element formation region and a second element formation region. The first element formation region and the second element formation region are separated from each other, for example, by an insulating region for providing isolation, i.e., an isolation region 4 formed of, for example, a shallow trench isolation (STI). A p-type well region 2 and an n-channel MISFET are formed in the first element formation region. An n-type well region 3 and a p-channel MISFET are formed in the second element formation region. The isolation region 4 is formed by first forming a shallow trench in the p-type semiconductor substrate 1 and then selectively filling the trench with an insulating film (for example, a silicon oxide film).

The n-channel MISFET includes, as main components, a gate electrode 6n formed of n-type polysilicon on a surface of the p-type well region 2 (i.e., a channel formation region) with a gate insulating film 5 interposed between the gate electrode 6n and the p-type well region 2, a silicide layer (which will be herein referred to as an "on-gate silicide layer) 12nA formed on the gate electrode 6n, insulating sidewall spacers 9 formed on side surfaces of a gate electrode portion 20n including the gate electrode 6n and the on-gate silicide layer 12nA, n-type source/drain regions 19n, and a silicide layer (which will be herein referred to as an "on-source/drain silicide layer") 12nB formed on respective n-type semiconductor regions 10 of the n-type source/drain regions 19n. In this specification, a silicide layer 12 is used as a general term for the on-gate silicide layer 12nA (and an on-gate silicide layer 12pA which will be described later) and the on-source/drain silicide layer 12nB (and an on-source/drain silicide layer 12pB which will be described later). As a feature of this embodiment, a height of a gate electrode portion 20n of the n-channel MISFET (i.e., a height of an upper surface of the on-gate silicide layer 12nA) is lower than a height of an upper edge of each of the sidewall spacers 9 provided on the side surfaces of the gate electrode portion 20n. In other words, a recess surrounded by upper portions of the sidewall spacers 9 exists on the gate electrode portion 20n. Each of the n-type source/drain regions 19n includes an associated one of n-type semiconductor regions (extension regions) 7 and an associated one of the n-type semiconductor regions 10. The n-type semiconductor regions 7 are provided so as to be located on both sides of the gate electrode 6n, respectively, in the p-type well region 2. The n-type semiconductor regions (heavily doped source/drain regions) 10 are formed so that each of the n-type semiconductor regions 10 is provided in part of the p-type well region 2 located at a side of an associated one of the sidewall spacers 9 and each of the n-type semiconductor regions 10 has a junction with the p-type well region 2 at a deeper location than a junction between each of the n-type semiconductor regions 7 and the p-type well region 2. The n-type semiconductor regions 7 are formed in a self aligning manner with respect to the gate electrode 6n and also the n-type semiconductor regions 10 are formed in a self aligning manner with respect to the sidewall spacers 9 formed on respective side surfaces of the gate electrode 6n. An impurity concentration of each of the n-type semiconductor regions 10 is higher than that of each of the n-type semiconductor regions 7.

The p-channel MISFET includes, as main components, a gate electrode 6p formed of p-type polysilicon on a surface of the n-type well region 3 (i.e., a channel formation region) with a gate insulating film 5 interposed between the gate electrode 6p and the n-type well region 3, an on-gate silicide layer 12pA formed on the gate electrode 6p, insulating sidewall spacers 9 formed on side surfaces of a gate electrode portion 20p including the gate electrode 6p and the on-gate silicide layer 12pA, p-type source/drain regions 19p, and an on-source/drain silicide layer 12pB formed on respective p-type semiconductor regions 11 of the p-type source/drain regions 19p. As a feature of this embodiment, a height of a gate electrode portion 20p of the p-channel MISFET (i.e., a height of an upper surface of the on-gate silicide layer 12pA) is lower than a height of an upper edge of each of the sidewall spacers 9 provided on the side surfaces of the gate electrode portion 20p. In other words, a recess surrounded by upper portions of the sidewall spacers 9 exists on the gate electrode portion 20p. Each of the n-type source/drain regions 19p includes an associated one of p-type semiconductor regions (extension regions) 8 and an associated one of the p-type semiconductor regions 11. The p-type semiconductor regions 8 are provided so as to be located on both sides of the gate electrode 6p, respectively, in the n-type well region 3. The p-type semiconductor regions (heavily doped source/drain regions) 11 are formed so that each of the p-type semiconductor regions 11 is provided in part of the n-type well region 3 located at a side of an associated one of the sidewall spacers 9 and each of the p-type semiconductor regions 11 has a junction with the n-type well region 3 at a deeper location than a junction between each of the p-type semiconductor regions 8 and the n-type well region 3. The p-type semiconductor regions 8 are formed in a self aligning manner with respect to the gate electrode 6p and also the p-type semiconductor regions 11 are formed in a self aligning manner with respect to the sidewall spacers 9. An impurity concentration of each of the p-type semiconductor regions 11 is higher than that of each of the p-type semiconductor regions 8.

A silicon nitride film 13 serving as an insulating film (which will be herein referred to as a "tensile stress film") for generating a tensile stress is formed over the gate electrode portions 20n and 20p, the sidewall spacers 9 and the source/drain regions 19n and 19p. On the silicon nitride film 13, an interlevel insulating film 15 of, for example, a silicon oxide film is formed. Accordingly, the silicon nitride film 13 exists between the interlevel insulating film 15 and each of the on-gate slicide layers 12nA of the gate electrode portion 20n and the on-gate silicide layer 12pA of the gate electrode portion 20p, between the interlevel insulating film 15 and each of the insulating sidewall spacers 9, and between the interlevel insulating film 15 and each of the on-source/drain silicide layer 12nB on the source/drain region 19n and the on-source/drain silicide layer 12pB on the source/drain region 19p. In this specification, a tensile stress film means to be an insulating film for generating a tensile stress along the gate length direction in a channel region located under a gate electrode. The silicon nitride film 13 serving as a tensile stress film is deposited, for example, by sub-atmospheric pressure chemical vapor deposition (SA-CVD).

Figure 2:
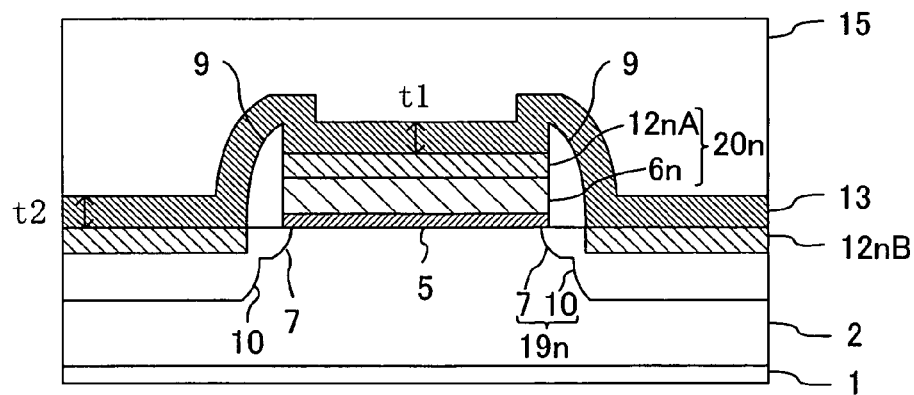
FIG. 2 is a cross-sectional view of a semiconductor device according to a comparison example in which a gate length of a MISFET is sufficiently large with respect to a deposition thickness of a stress film.

In this embodiment, the height of each of the gate electrode portions 20n and 20p is lower than the upper edge of each of the insulating sidewall spacers 9. Thus, a thickness t1 of part of the silicon nitride film 13 located in a center portion of each of the gate electrode portion 20n of the n-channel MISFET and the gate electrode portion 20p of the p-channel MISFET in the gate length direction is larger than a thickness (deposition thickness t2) of part of the silicon nitride film 13 located over other part (i.e., the on-source/drain silicide layer 12nB and 12pB, the insulating sidewall spacers 9 and the like). This structure can be achieved if the following conditions are satisfied: a recess surrounded by the upper portions of the insulating sidewall spacers 9 exists on each of the gate electrode portions 20n and 20p in the manner described above; and a gate length of each of the MISFETs is sufficiently small. For example, in the case shown in FIG. 2 where the gate length of a MISFET is sufficiently large with respect to the deposition thickness t2 of the silicon nitride film 13, the thickness t1 of the part of the silicon nitride film 13 located in the center portion of the gate electrode portion 20n is about the same as the deposition thickness t2 of the silicon nitride film 13 formed on the on-source/drain silicide layer 12nB. On the other hand, as shown in FIG. 1, when the gate length of a MISFET is sufficiently small, a structure in which the thickness t1 of the part of the silicon nitride film 13 located on each of the gate electrode portion 20n and the gate electrode portion 20p is larger than the deposition thickness t2 can be formed in a self aligning manner due to a coverage (step coverage) of the silicon nitride film 13 and the existence of the recess surrounded by the upper portions of the insulating sidewall spacers 9 on each of the gate electrode portions 20n and 20p. Specifically, if the deposition thickness t2 of the silicon nitride film 13 is equal to or larger than half of a minimum gate length of MISFETs formed on active regions of the p-type semiconductor substrate 1, in other words, the minimum gate length of the MISFETs is twice of or smaller than the deposition thickness t2 of the silicon nitride film 13, the recesses on the gate electrode portions 20n and 20p are completely buried in the silicon nitride film 13, so that the thickness t1 of the part of the silicon nitride film 13 located on each of the gate electrode portions 20n and 20p can be reliably made to be larger than the deposition thickness t2.

With the above-described structure, only the thickness t1 of the part of the silicon nitride film 13 located on each of the gate electrode portions 20n and 20p can be selectively made to be larger than the deposition thickness t2. Thus, compared to a known structure (in which a recess surrounded by upper portions of side wall spacers on each gate electrode does not exist) using a stress film having the same deposition thickness as that in the structure of this embodiment, a stress generated in an active region (channel formation region) in the p-type semiconductor substrate 1 can be effectively increased. Accordingly, a driving power of the n-channel MISFET can be improved by increasing a drain current while the deposition thickness t2 itself of the silicon nitride film 13 is controlled to be a thickness with which contact failure is prevented. Therefore, a high performance semiconductor device can be realized. In this case, the gate electrodes 6n and 6p are preferably arranged so that the gate length direction is along a <100> direction of silicon in the semiconductor substrate 1. In this manner, if the gate electrodes 6n and 6p are arranged so that their gate length direction is along the <100> direction, while in the n-channel MISFET, the driving power is improved by the tensile stress film formed of the silicon nitride film 13, in the p-channel MISFET, the driving power is hardly influenced by the tensile stress film of the silicon nitride film 13 and reduction in the driving power can be suppressed, compared to the known structure.

According to the first embodiment, the silicon nitride film 13 is a tensile stress film and thus the first embodiment is effective in improving the driving power of the n-channel MISFET. Moreover, in the first embodiment, instead of the silicon nitride film 13, another tensile stress film of some other type may be used.

Hereafter, a method for fabricating the semiconductor device according to the first embodiment will be described.

FIGS. 3A through 3E are cross-sectional views illustrating respective steps of the method for fabricating the semiconductor device according to the first embodiment.

Figure 3A:
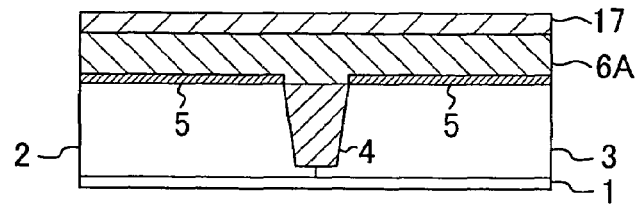
FIGS. 3A through 3E are cross-sectional views illustrating respective steps of a method for fabricating a semiconductor device according to a first embodiment.

First, as shown in FIG. 3A, a p-type semiconductor substrate (which will be herein referred to merely as a "p-type substrate") formed of, for example, single crystalline silicon is prepared and then a p-type well region 2 and an n-type well region 3 are selectively formed in the p-type substrate 1. Next, in the p-type substrate 1, an isolation region 4 is formed as a region for separating the p-type substrate 1 into the first element formation region (active region) and a second element formation region (active region) from each other. The isolation region 4 is formed by performing, after formation of a shallow trench (for example, having a depth of about 300 nm) in the p-type substrate 1, CVD (chemical vapor deposition) to form an insulating film of, for example, a silicon oxide film on the p-type substrate 1 and then performing planarization by CMP (chemical mechanical polishing) so that the insulating film is left only in the shallow trench.

Next, heat treatment is performed to form a gate insulating film 5 of a silicon oxide film, for example, having a thickness of about 1-3 nm on the element formation regions of the p-type substrate 1. Thereafter, a polycrystalline silicon film 6A is formed over the p-type substrate 1 so as to have a thickness of, for example, 140 nm, for example, by CVD. In the polycrystalline silicon film 6A, an impurity for reducing a resistance value and suppressing depletion is injected while or after the polycrystalline silicon film 6A is deposited. In this case, it is preferable that an n-type impurity is introduced into part of the polycrystalline silicon film serving as a gate electrode of an n-channel MISFET and a p-type impurity is introduced into part of the polycrystalline silicon film serving as a gate electrode of a p-channel MISFET. Next, a silicon oxide film 17 serving as a hard mask used when gate patterning is performed is formed on the polycrystalline silicon film 6A so as to have a thickness of, for example, 20 nm by CVD.

Figure 3B:
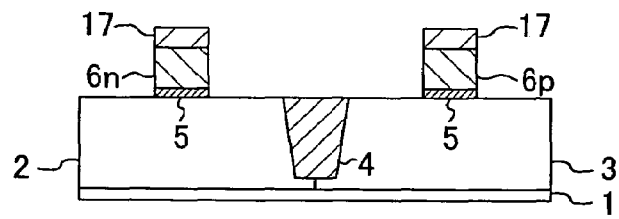

Next, as shown in FIG. 3B, after lithography and etching have been performed, the silicon oxide film 17 is patterned into a gate electrode shape. Then, using the patterned silicon oxide film 17 as a hard mask, the polycrystalline silicon film 6A is patterned, thereby forming a gate electrode 6n on the first element formation region (n-channel MISFET formation region) to have a gate length of, for example, 60 nm and a gate electrode 6p on the second element formation region (p-channel MISFET formation region) to have a gate length of, for example 60 nm.

Figure 3C:
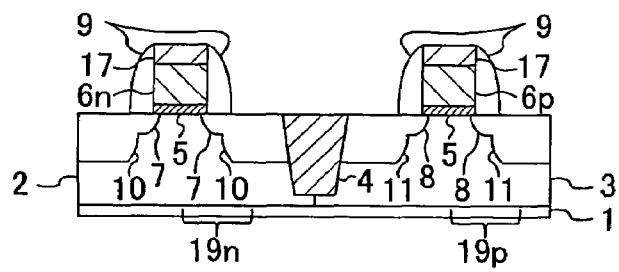

Next, as shown in FIG. 3C, as an n-type impurity, for example, arsenic (As) is selectively introduced by ion implantation to part of the p-type well region 2 on which the gate electrode 6n is not formed. Thus, a pair of n-type semiconductor regions (extension regions) 7 is formed. Thereafter, as a p-type impurity, for example, boron difluoride ($BF_2$) is selectively introduced by ion implantation to part of the n-type well region 3 on which the gate electrode 6p is not formed. Thus, a pair of p-type semiconductor regions (extension regions) 8 is formed. Formation of the n-type semiconductor regions 7 is performed with the p-channel MISFET formation region covered by a photoresist mask. Formation of the p-type semiconductor regions 8 is performed with the n-channel MISFET formation region covered by a photoresist mask.

Next, sidewall spacers 9 are formed on side surfaces of the gate electrodes 6n and 6p and the patterned silicon oxide film 17 in the element formation regions so that each of the insulating sidewall spacers 9 has a thickness of about 30-60 nm in the gate length direction. The sidewall spacers 9 are formed by forming an insulating film of, for example, a silicon nitride film over the p-type substrate 1 by CVD and then performing anisotropy etching such as RIE (reactive ion etching) and the like to the insulating film. Subsequently, as an n-type impurity, for example, arsenic (As) is selectively introduced by ion implantation to part of the p-type well region 2 on which the gate electrode 6n and the insulating sidewall spacers 9 are not formed. Thus, a pair of n-type semiconductor regions (heavily doped source/drain regions) 10 is formed. Then, as a p-type impurity, for example, boron difluoride ($BF_2$) is selectively introduced to part of the n-type well region 3 on which the gate electrode 6p and the insulating sidewall spacers 9 are not formed. Thus, a pair of p-type semiconductor regions (heavily doped source/drain regions) 11 is formed. Formation of the n-type semiconductor regions 10 is performed with the p-channel MISFET formation region covered by a photoresist mask. Formation of the p-channel MISFET semiconductor regions 11 is performed with the n-channel MISFET formation region covered by a photoresist mask. In the manner shown in FIG. 3C, the n-type source/drain regions 19n of the n-channel MISFET each of which includes an associated one of the n-type semiconductor regions 7 and an associated one of the n-type semiconductor regions 10 are formed, and the p-type source/drain regions 19p of the p-channel MISFET each of which includes an associated one of the p-type semiconductor regions 8 and an associated one of the p-type semiconductor regions 11 are formed.

Figure 3D:
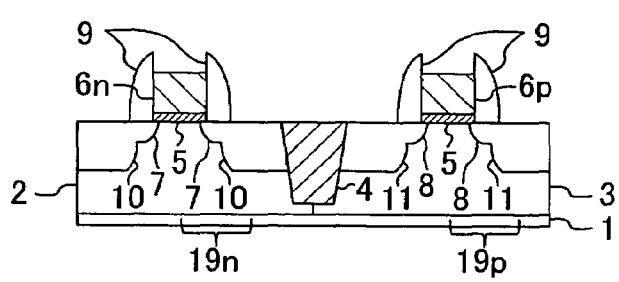

Next, as shown in FIG. 3D, wet treatment, for example, using a HF solution or the like is performed, thereby removing the silicon oxide film 17 formed on the gate electrode 6n of the n-channel MISFET formation region and the gate electrode 6p of the p-channel MISFET formation region, native oxide formed on the n-type semiconductor regions 10 and the p-type semiconductor regions 11, and the like. Thus, respective surfaces of the gate electrodes 6n and 6p, the n-type semiconductor regions 10 and the p-type semiconductor regions 11 are exposed. As a result, as shown in FIG. 3D, a recess having a depth of, for example, 20 nm and surrounded by upper portions of the sidewall spacers 9 is formed on each of the gate electrodes 6n and 6p.

Figure 3E:
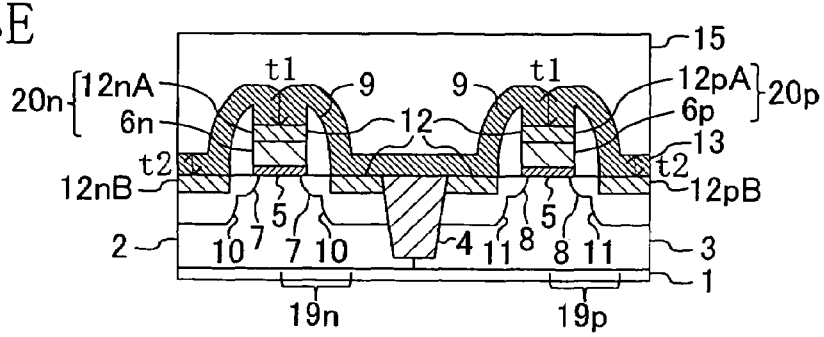

Next, as a refractory metal film, for example, a nickel (Ni) film is formed over the p-type substrate 1 so as to have a thickness of 11 nm by sputtering. Thereafter, heat treatment is performed. Thus, as shown in FIG. 3E, silicon (Si) in the gate electrodes 6n and 6p of the MISFETs and Ni in the nickel film are brought into reaction with one another, thereby forming on-gate silicide (NiSi) layers 12nA and 12pA having a thickness of, for example, 25 nm on respective surfaces of the gate electrodes 6n and 6p, respectively, and Si in the semiconductor regions 10 and 11 and Ni in the nickel film are brought into reaction with one another, thereby forming on-source/drain silicide (NiSi) layers 12nB and 12pB on respective surfaces of the semiconductor regions 10 and 11. Thereafter, unreacted nickel film remaining on other regions of the substrate than the regions on which the silicide layer 12 is formed is selectively removed and then heat treatment is performed to activate the silicide layer 12. Thus, the gate electrode portion 20n of the n-channel MISFET including the gate electrode 6n and the on-gate silicide layer 12nA and the gate electrode portion 20p of the p-channel MISFET including the gate electrode 6p and the on-gate silicide layer 12pA are formed. In this case, the gate electrode portions 20n and 20p are formed so that respective heights of the electrode portions 20n and 20p (heights of respective upper surfaces of the on-gate silicide layers 12nA and 12pA) are smaller than an upper edge of each of the sidewall spacers 9. Accordingly, a recess surrounded by upper portions of the sidewall spacers 9 and having a depth of, for example, 20 nm is formed on each of the gate electrode portions 20n and 20p.

Next, a silicon nitride film 13 serving as a tensile stress film is formed over the p-type substrate 1 so as to have a thickness of, for example, 30 nm, for example, by sub-atmospheric pressure chemical vapor deposition (SA-CVD). As deposition conditions for forming the silicon nitride film 13, for example, a high-frequency power is 350-400 W and a pressure inside a chamber is 300-350 Torr (39.9-46.55 kPa).

In this embodiment, a deposition thickness t2 of the silicon nitride film 13 is set to be equal to or larger than half of a minimum gate length of the MISFETs formed on the active regions. In this case, due to the existence of a recess surrounded by upper portions of the sidewall spacers 9 on each of the gate electrode portions 20n and 20p, a thickness t1 of each of the parts of the silicon nitride film 13 located on respective center parts, in the gate length direction, of the gate electrode portions 20n and 20p of the MISFETs with the minimum gate length is larger than the deposition thickness t2 in a self aligning manner. For example, assume that when the gate length of each of the gate electrodes 6n and 6p is 60 nm, the deposition thickness t2 of the silicon nitride film 13 is 30 nm. In such a case, if a depth of each recess surrounded by upper portions of the sidewall spacers 9 formed on each of the gate electrode 20n and 20p is set to be 20 nm, the thickness t1 of the part of the silicon nitride film 13 located on each of the gate electrode 20n and 20p becomes about 50 nm. That is, in this embodiment, since the part of the silicon nitride film 13 having a tensile stress and located on each of the gate electrodes 20n and 20p is larger than a thickness of other part of the silicon nitride film 13, a tensile stress can be more effectively generated in the channel formation regions of the MISFETs. As a result, a driving power of the n-channel MISFET can be improved.

Next, an interlevel insulating film 15 of, for example, a silicon oxide film is formed over the p-type substrate 1 by plasma CVD and then a surface of the interlevel insulting film 15 is flattened by CMP. Thereafter, although not shown in the drawings, a contact hole(s), a metal interconnect layer(s) and the like are formed using a known technique to complete fabrication of the semiconductor device of this embodiment.

In the first embodiment, the polycrystalline silicon film 6A is used as a material of the gate electrodes 6n and 6p. However, instead of the polycrystalline silicon film 6A, some other conductive material may be used. Moreover, in this embodiment, the silicon oxide film 17 is formed on the polycrystalline silicon film 6A. Instead of forming the silicon oxide film 17, a protective film made of some other material may be formed.

In the first embodiment, the deposition thickness t2 itself of the silicon nitride film 13 can be controlled to be a thickness with which contact failure is prevented. This effect will be described in detail with reference to FIGS. 4A through 4D. In FIGS. 4A through 4D, each member also shown in FIG. 1 and FIGS. 3A through 3E is identified by the same reference numeral and therefore description thereof will be appropriately omitted.

Figure 4A:
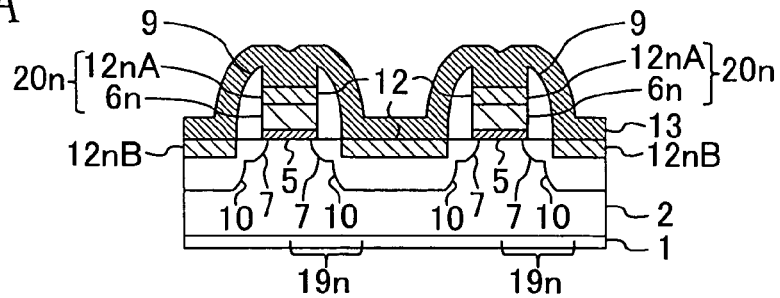
FIGS. 4A through 4D are cross-sectional views illustrating effects of the first embodiment of the present invention.
Figure 4B:
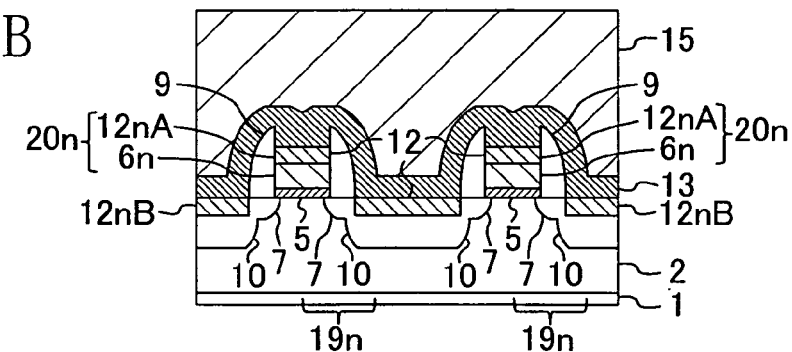
Figure 4C:
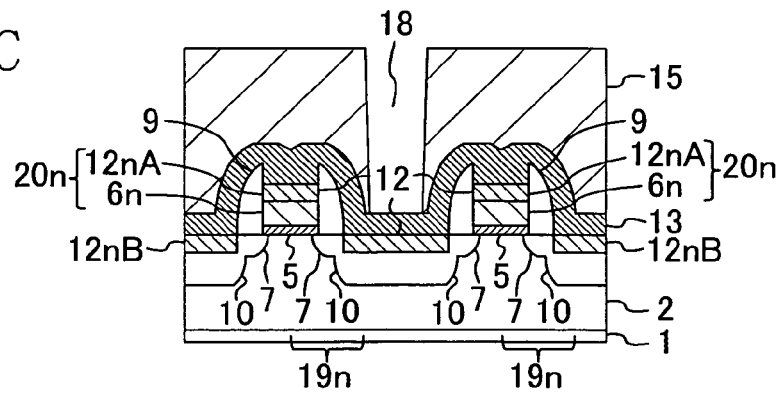
Figure 4D:
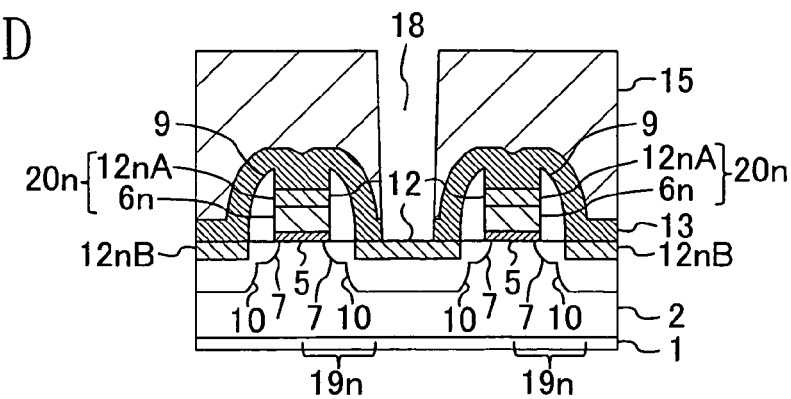

FIG. 4A illustrates how two n-channel MISFETs (each including mainly a gate electrode 6n formed on a surface of a p-type well region 2, i.e., a channel formation region with a gate insulating film 5 interposed between the gate electrode 6n and the p-type well region 2, an on-gate silicide layer 12nA formed on the gate electrode 6n, sidewall spacers 9 formed on side surfaces of a gate electrode portion 20n including the gate electrode 6n and the on-gate silicide layer 12nA and n-type source/drain regions 19n) are formed on the same active region formed of a p-type semiconductor substrate 1 so as to be adjacent to each other in the semiconductor device in FIG. 1 according to this embodiment. As shown in FIG. 4A, a silicon nitride film 13 for generating a tensile stress is formed on the p-type semiconductor substrate 1 and then, as shown in FIG. 4B, an interlevel insulating film 15 of, for example, a silicon oxide film is formed on the silicon nitride film 13. Thereafter, holes for obtaining electrical contacts with n-type semiconductor regions 10 which are to be n-type source/drain regions 19n of the n-channel MISFETs are formed in the interlevel insulating film 15 and the silicon nitride film 13. Specifically, as shown in FIG. 4C, first, with using the silicon nitride film 13 as an etching stopper film, a hole 18 is formed in the interlevel insulating film 15 to reach the silicon nitride film 13. Next, as shown in FIG. 4D, to make the hole 18 reach the on-source/drain silicide layer 12 on a surface of the n-type semiconductor region 10, part of the silicon nitride film 13 is removed. In this embodiment, the deposition thickness t2 of the silicon nitride film 13 is controlled to be a thickness with which contact failures are prevented. Specifically, when a distance between gate electrodes 6n is small, as shown in FIG. 4A, a thickness of part of the silicon nitride film 13 located between the gate electrodes 6n does not become larger than the deposition thickness. Accordingly, as shown in FIG. 4D, etching of the silicon nitride film 13 for formation of the hole 18 can be reliably performed. Therefore, opening failure in the hole 18 is not caused. That is, contact failure, i.e., failure to obtain electrical connection with the n-type semiconductor regions 10 can be prevented.

Second Embodiment

Hereafter, a semiconductor device according to a second embodiment of the present invention and a method of the fabricating the semiconductor device will be described. Specifically, as an example of application of the second embodiment, a semiconductor device having complementary MIS- FETs with a minimum gate length of 0.1 µm or less will be described in detail with reference to the accompanying drawings.

Figure 5:
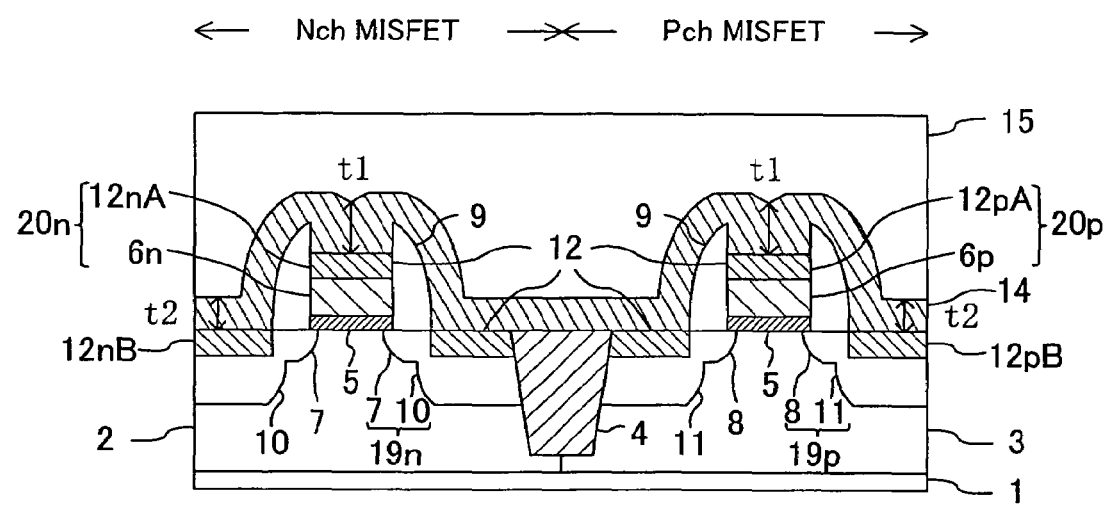
FIG. 5 is a cross-sectional view of a semiconductor device according to a second embodiment of the present invention.

FIG. 5 is a cross-sectional view illustrating a schematic structure of a semiconductor device according to the second embodiment. In FIG. 5, each member also shown in FIG. 1 in the first embodiment is identified by the same reference numeral and therefore the description thereof will be appropriately omitted.

The second embodiment is different from the first embodiment in that, as shown in FIG. 5, as a stress film, instead of the silicon nitride film 13 for generating a tensile stress in an active region of a p-type semiconductor substrate 1 (specifically, a channel formation region in each MISFET), a silicon nitride film 14 serving as an insulating film (which will be referred to be as a "compressive stress film") for generating a compressive stress in the channel formation region is formed between an interlevel insulating film 15 and each of an n-channel MISFET and a p-channel MISFET. In this case, the silicon nitride film 14 is deposited, for example, by high density plasma CVD (HDP-CVD). In the first embodiment, the driving power of the n-channel MISFET can be improved by the silicon nitride film 13 for generating a tensile stress. According to the second embodiment, however, a driving power of the p-channel MISFET can be improved by the silicon nitride film 14 for generating a compressive stress. In this case, gate electrodes 6n and 6p are preferably arranged so that a gate length direction is along a <110> direction of silicon in the semiconductor substrate 1. Thus, in the p-channel MISFET, its driving power is improved by the compressive stress film of the silicon nitride film 14.

Moreover, according to the second embodiment, a thickness t1 of each of parts of the silicon nitride film 14 located on gate electrode portions 20n and 20p is selectively made larger than a deposition thickness t2. Thus, compared to the known structure (i.e., a structure in which a recess surrounded by upper portions of sidewall spacers does not exist on each electrode portion) using a stress film with the same deposition thickness, a stress generated in an active region (channel formation region) of the p-type semiconductor substrate 1 can be effectively increased. Therefore, the driving power of the p-channel MISFET can be improved by increasing a drain current while the deposition thickness t2 itself of the silicon nitride film 14 is controlled to be a thickness with which contact failure is prevented. Accordingly, a high performance semiconductor device can be achieved.

In the second embodiment, instead of the silicon nitride film 14, a compressive stress film of some other type may be used.

Hereafter, a method for fabricating a semiconductor device according to the second embodiment will be described.

FIGS. 6A through 6E are cross-sectional views illustrating respective steps of the method for fabricating a semiconductor device according to the second embodiment. In FIGS. 6A through 6E, each member also shown in FIGS. 3A through 3E in the first embodiment is identified by the same reference numeral and therefore the description thereof will be appropriately omitted. Only difference between the method for fabricating a semiconductor method according to the second embodiment and the method of the first embodiment is a deposition technique used for forming a stress film.

In the second embodiment, as shown in FIGS. 6A through 6E, process steps up to the step of forming a silicide layer 12 are performed in the same manner as shown in FIGS. 3A through 3E. Thereafter, a silicon nitride film 14 serving as a compressive film is formed over a p-type substrate 1 so as to have a thickness of, for example, 30 nm, for example, by high density plasma CVD (HDP-CVD). As deposition conditions for forming the silicon nitride film 14, for example, a high-frequency power is 600-700 W and a pressure inside a chamber is 5-10 Torr (665-1330 Pa). In this specification, a compressive stress film means to be an insulating film for generating a compressive stress along the gate length direction in a channel region located under a gate electrode.

In this embodiment, the deposition thickness t2 of the silicon nitride film 14 is set to be equal to or larger than half of a minimum gate length of MISFETs formed on active regions. In this case, due to the existence of a recess surrounded by upper portions of wall spacers 9 on each of the gate electrode portions 20n and 20p, the thickness t1 of each of the parts of the silicon nitride film 14 located on respective center portions of the gate electrode portions 20n and 20p of the MISFETs with the minimum gate length is larger than the deposition thickness t2 in a self-aligning manner. Specifically, in this embodiment, the thickness of each of the parts of the silicon nitride film 14 located on the gate electrode portions 20n and 20p is larger than a thickness of other part of silicon nitride film 14, and thus a compressive stress can be more effectively generated in a channel formation region of each MISFET. As a result, the driving power of the p-channel MISFET can be improved.

Next, an interlevel insulating film 15 of, for example, a silicon oxide film is formed over the p-type substrate 1 by plasma CVD and then a surface of the interlevel insulating film 15 is flattened by CMP. Thereafter, although not shown in the drawings, a contact hole(s), a metal interconnect layer(s) and the like are formed using a known technique to complete fabrication of the semiconductor device of this embodiment.

In the second embodiment, the polycrystalline silicon film 6A is used as a material of the gate electrodes 6n and 6p. However, instead of the polycrystalline silicon film 6A, some other conductive material may be used. Moreover, in this embodiment, the silicon oxide film 17 is formed on the polycrystalline silicon film 6A. Instead of forming the silicon oxide film 17, a protective film made of some other material may be formed.

In the second embodiment, the deposition thickness t2 itself of the silicon nitride film 14 can be controlled to be a thickness with which contact failure is prevented. This is the same effect as that of the first embodiment shown in FIGS. 4A through 4D.

Third Embodiment

Hereafter, a semiconductor device according to a third embodiment of the present invention and a method for fabricating the semiconductor device will be described. Specifically, as an example of application of the third embodiment, a semiconductor device having complementary MISFETs with a minimum gate length of 0.1 µm or less will be described with reference to the accompanying drawings. This embodiment corresponds to a modified example of the first embodiment and an objective of this embodiment is to improve a driving power of an n-channel MISFET and suppress reduction in a driving power of a p-channel MISFET.

Figure 7:
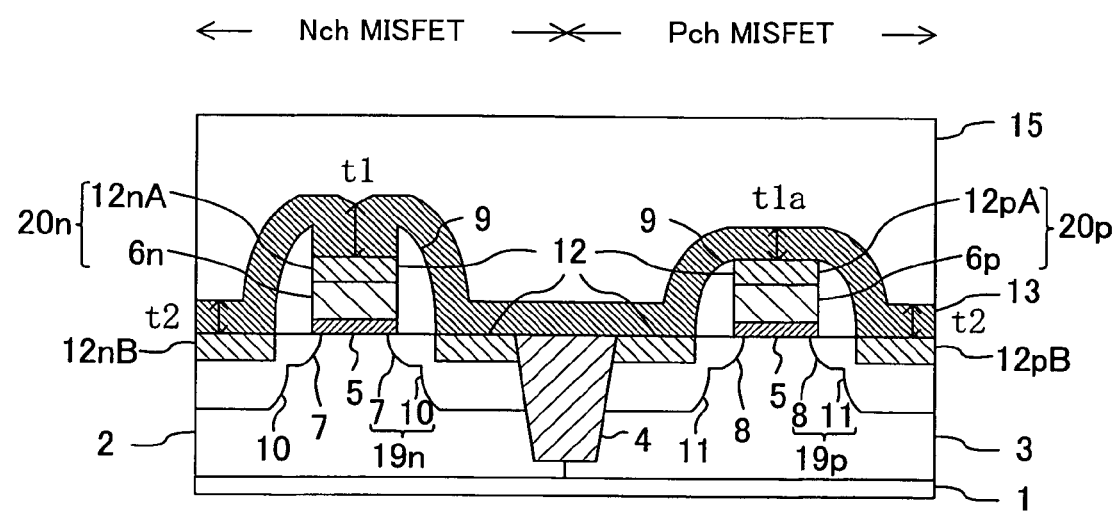
FIG. 7 is a cross-sectional view of a semiconductor device according to a third embodiment of the present invention.

FIG. 7 is a cross-sectional view illustrating a schematic structure of a semiconductor device according to the third embodiment. In FIG. 7, each member also shown in FIG. 1 in the first embodiment is identified by the same reference numeral and therefore the description thereof will be appropriately omitted.

The third embodiment is different from the first embodiment in that, as shown in FIG. 7, a height of a gate electrode portion 20p including a gate electrode 6p and an on-gate silicide layer 12pA of a p-channel MISFET is equal to or larger than a height of an upper edge of each of sidewall spacers 9 provided on side surfaces of the gate electrode portion 20p. That is, a recess surrounded by the sidewall spacers 9 does not exist on the on-gate silicide layer 12pA of the p-channel MISFET.

In the above-described structure of this embodiment, in contrast with a thickness t1 of part of a silicon nitride film 13 located on a gate electrode portion 20n of an n-channel MISFET being larger than a thickness (deposition thickness t2) of other part of the silicon nitride film 13 as in the first embodiment, a thickness t1a of part of the silicon nitride film 13 located on the gate electrode portion 20p of the p-channel MISFET is substantially the same as a deposition thickness t2.

Specifically, according to the third embodiment, by reducing the thickness of the part of the silicon nitride film 13 (a tensile stress film for generating a tensile stress in a channel formation region of a MISFET) located on the gate electrode portion 20p of the p-channel MISFET to a smaller thickness than that in the first embodiment, a tensile stress generated in the channel formation region of the p-channel MISFET can be weakened, compared to the first embodiment. Accordingly, reduction in a driving power of the p-channel MISFET can be suppressed while a driving power of the n-channel MISFET is improved.

Hereafter, a method for fabricating a semiconductor device according to the third embodiment will be described.

FIGS. 8A through 8F are cross-sectional views illustrating respective steps of the method for fabricating semiconductor device according to the third embodiment. In FIGS. 8A through 8F, each member also shown in FIGS. 3A through 3E in the first embodiment is identified by the same reference numeral and therefore the description thereof will be appropriately omitted.

Figure 8A:
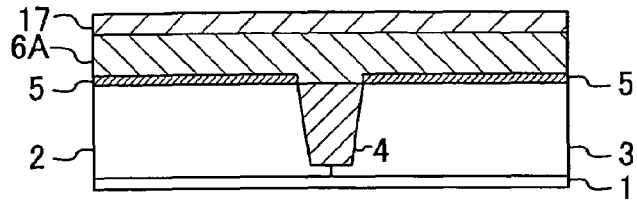
FIGS. 8A through 8F are cross-sectional views illustrating respective steps of a method for fabricating a semiconductor device according to the third embodiment of the present invention.

In the third embodiment, first, as shown in FIG. 8A, process steps up to the step of forming a silicon oxide film 17 serving as a hard mask used in gate patterning on a polycrystalline silicon film 6A are performed in the same manner as shown in FIG. 3A in the first embodiment.

Figure 8B:
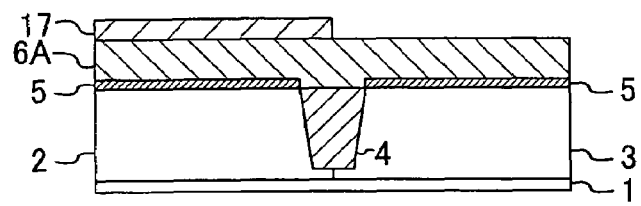

Next, as shown in FIG. 8B, with an n-channel MISFET formation region covered by a resist mask (not shown), etching is performed to selectively remove part of the silicon oxide film 17 located on a p-channel MISFET formation region. Thereafter, the resist mask is removed.

Figure 8C:
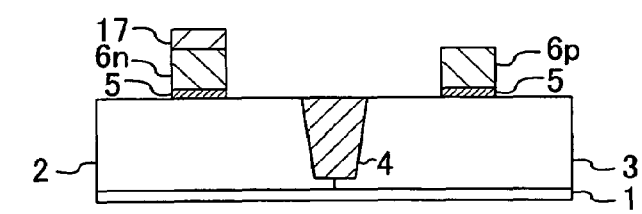

Next, as shown in FIG. 8C, after lithography and etching have been performed, parts of the silicon oxide film 17 and the polycrystalline silicon film 6A which are located over the n-MISFET formation region and part of the polycrystalline silicon film 6A located over the p-channel MISFET formation region are patterned, thereby forming a gate electrode 6n on a first element formation region (n-channel MISFET formation region) and a gate electrode 6p on a second element formation region (p-channel MISFET formation region). At this point, the silicon oxide film 17 remains on the gate electrode 6n in the n-channel MISFET formation region.

Figure 8D:
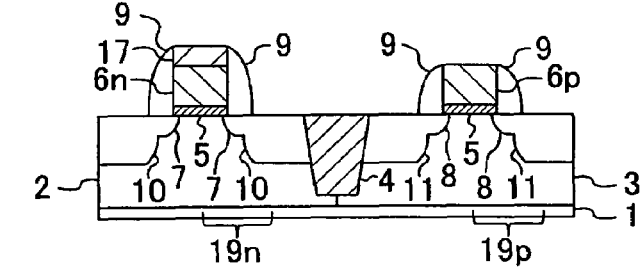

Next, as shown in FIG. 8D, as an n-type impurity, for example, arsenic (As) is selectively introduced by ion implantation to part of a p-type well region 2 on which the gate electrode 6n is not formed. Thus, a pair of n-type semiconductor regions (extension regions) 7 is formed. Thereafter, as a p-type impurity, for example, boron difluoride (BF$_2$) is selectively introduced by ion implantation to part of an n-type well region 3 on which the gate electrode 6p is not formed. Thus, a pair of p-type semiconductor regions (extension regions) 8 is formed. Formation of the n-type semiconductor regions 7 is performed with the p-channel MISFET formation region covered by a photoresist mask. Formation of the p-type semiconductor regions 8 is performed with the n-channel MISFET formation region covered by a photoresist mask.

Next, sidewall spacers 9 are formed on side surfaces of the gate electrode 6n of the n-channel MISFET formation region and the silicon oxide film 17 and side surfaces of the gate electrode 6p of the p-channel MISFET formation region so that each of the insulating sidewall spacers 9 has a thickness of, for example, about 30-60 nm in the gate length direction. The sidewall spacers 9 are formed by forming an insulating film of, for example, a silicon nitride film over the p-type substrate 1 by CVD and then performing anisotropy etching such as RIE (reactive ion etching) and the like to the insulating film. Subsequently, as an n-type impurity, for example, arsenic (As) is selectively introduced by ion implantation to part of the p-type well region 2 on which the gate electrode 6n and the insulating sidewall spacers 9 are not formed. Thus, a pair of n-type semiconductor regions 10 is formed. Then, as a p-type impurity, for example, boron difluoride (BF$_2$) is selectively introduced to part of the n-type well region 3 on which the gate electrode 6p and the insulating sidewall spacers 9 are not formed. Thus, a pair of p-type semiconductor regions 11 is formed. Formation of the n-type semiconductor regions 10 is performed with the p-channel MISFET formation region covered by a photoresist mask. Formation of the p-channel MISFET semiconductor regions 11 is performed with the n-channel MISFET formation region covered by a photoresist mask. In the manner shown in FIG. 8D, n-type source/drain regions 19n of the n-channel MISFET each of which includes an associated one of the n-type semiconductor regions 7 and an associated one of the n-type semiconductor regions 10 are formed, and p-type source/drain regions 19p of the p-channel MISFET each of which includes an associated one of the p-type semiconductor regions 8 and an associated one of the p-type semiconductor regions 11 are formed.

Figure 8E:
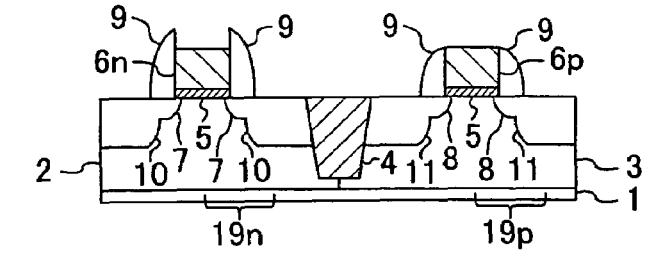

Next, as shown in FIG. 8E, wet treatment, for example, using a HF solution or the like is performed, thereby removing the silicon oxide film 17 formed on the gate electrode 6n of the n-channel MISFET formation region, native oxide formed on the n-type semiconductor regions 10 and the p-type semiconductor regions 11, and the like. Thus, respective surfaces of the gate electrodes 6n and 6p, the n-type semiconductor regions 10 and the p-type semiconductor regions 11 are exposed. As a result, as shown in FIG. 8E, a recess surrounded by upper portions of the sidewall spacers 9 is formed only on the gate electrode 6n of the n-channel MISFET formation region. In other words, a recess surrounded by upper portions of the sidewall spacers 9 is not formed on the gate electrode 6p of the p-channel MISFET formation region.

Figure 8F:
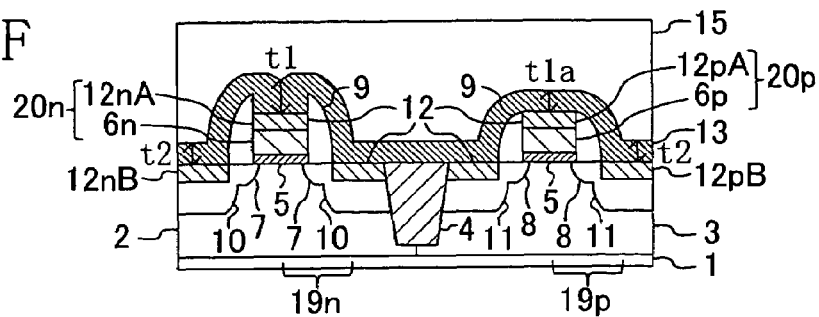

Next, as a refractory metal film, for example, a nickel (Ni) film is formed over the p-type substrate 1 by sputtering. Thereafter, heat treatment is performed. Thus, as shown in FIG. 8F, silicon (Si) in the gate electrodes 6n and 6p of the MISFETs and Ni in the nickel film are brought into reaction with one another, thereby forming on-gate silicide (NiSi) layers 12nA and 12pA on respective surfaces of the gate electrodes 6n and 6p, and Si in the semiconductor regions 10 and 11 and Ni in the nickel film are brought into reaction with one another, thereby forming on-source/drain silicide (NiSi) layers 12nB and 12pB on respective surfaces of the semiconductor regions 10 and 11. Thereafter, unreacted nickel film remaining on other regions of the substrate than the regions on which the silicide layer 12 is formed is selectively removed and then heat treatment is performed to activate the silicide layer 12.

Next, a silicon nitride film 13 having a tensile stress is formed over the p-type substrate 1 so as to have a thickness of, for example, 30 nm, for example, by sub-atmospheric pressure chemical vapor deposition (SA-CVD). As deposition conditions for forming the silicon nitride film 13, for example, a high-frequency power is 350-400 W and a pressure inside a chamber is 300-350 Torr (39.9-46.55 kPa).

In this embodiment, a deposition thickness t2 of the silicon nitride film 13 is set to be equal to or larger than half of a minimum gate length of the MISFETs formed on active regions. In this case, due to the existence of a recess surrounded by upper portions of the sidewall spacers 9 on the gate electrode portion 20n, a thickness t1 of part of the silicon nitride film 13 located on the gate electrode portion 20n of the n-channel MISFET with the minimum gate length becomes larger than the deposition thickness t2 in a self aligning manner. On the other hand, since a recess surrounded by upper surfaces of the sidewall spacers 9 does not exist on the gate electrode portion 20p, the thickness t1a of part of the silicon nitride film 13 located on the gate electrode portion 20p of the p-channel MISFET is substantially the same as the deposition thickness t2. With the above-described structure, according to this embodiment, a tensile stress applied in the channel formation region of the n-channel MISFET can be made larger than a tensile stress applied in the channel formation region of the p-channel MISFET. As a result, the driving power of the n-channel MISFET can be improved and reduction in the driving power of the p-channel MISFET can be suppressed.

Next, an interlevel insulating film 15 of, for example, a silicon oxide film is formed over the p-type substrate 1 by plasma CVD and then a surface of the interlevel insulting film 15 is flattened by CMP. Thereafter, although not shown in the drawings, a contact hole(s), a metal interconnect layer(s) and the like are formed using a known technique to complete fabrication of the semiconductor device of this embodiment.

In the third embodiment, the polycrystalline silicon film 6A is used as a material of the gate electrodes 6n and 6p. However, instead of the polycrystalline silicon film 6A, some other conductive material may be used. Moreover, in this embodiment, the silicon oxide film 17 is formed on the polycrystalline silicon film 6A. Instead of forming the silicon oxide film 17, a protective film made of some other material may be formed.

In the third embodiment, the deposition thickness t2 itself of the silicon nitride film 13 can be controlled to be a thickness with which contact failure is prevented. This is the same effect as that of the first embodiment shown in FIGS. 4A through 4D.

Fourth Embodiment

Hereafter, a semiconductor device according to a fourth embodiment of the present invention and a method for fabricating the semiconductor device will be described. Specifically, as an example of application of the fourth embodiment, a semiconductor device having complementary MISFETs with a minimum gate length of 0.1 µm or less will be described in detail with reference to the accompanying drawings. This embodiment corresponds to a modified example of the second embodiment and an objective of this embodiment is to improve a driving power of an n-channel MISFET and suppress reduction in a driving power of a p-channel MISFET.

Figure 9:
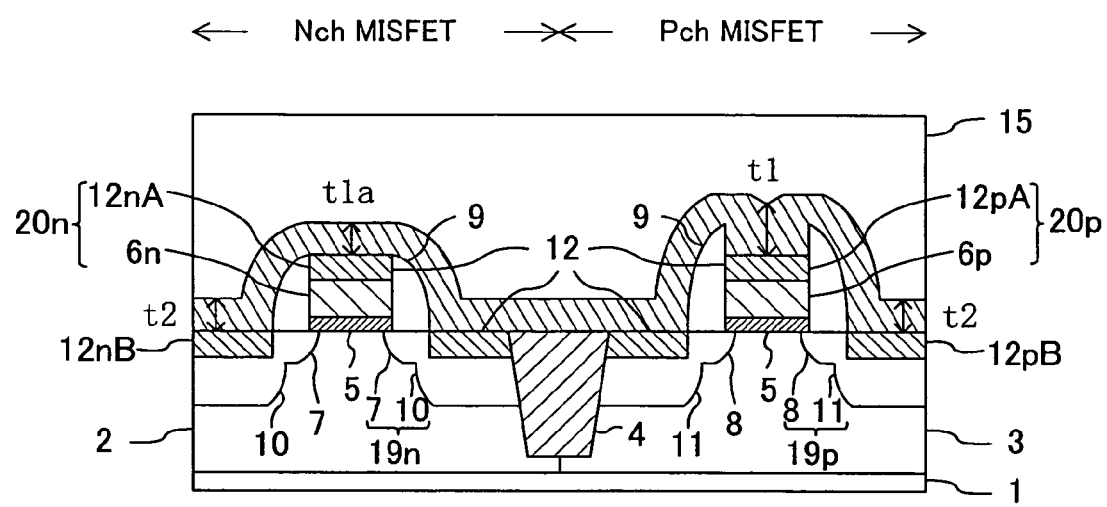
FIG. 9 is a cross-sectional view of a semiconductor device according to a fourth embodiment of the present invention.

FIG. 9 is a cross-sectional view illustrating a schematic structure of a semiconductor device according to the fourth embodiment. In FIG. 9, each member also shown in FIG. 5 in the second embodiment is identified by the same reference numeral and therefore the description thereof will be appropriately omitted.

The fourth embodiment is different from the second embodiment in that, as shown in FIG. 9, a height of a gate electrode portion 20n including a gate electrode 6n and an on-gate silicide layer 12nA of an n-channel MISFET is substantially equal to a height of an upper edge of each of sidewall spacers 9 provided on side surfaces of the gate electrode portion 20n. That is, a recess surrounded by the sidewall spacers 9 does not exist on the gate electrode portion 20n of the n-channel MISFET.

In the above-described structure of this embodiment, in contrast with a thickness t1 of part of a silicon nitride film 14 located on a gate electrode portion 20p including a gate electrode 6p and an on-gate silicide layer 12pA of a p-channel MISFET being larger than a thickness (deposition thickness t2) of other part of the silicon nitride film 14 as in the second embodiment, a thickness t1a of part of the silicon nitride film 14 located on the gate electrode portion 20n of the n-channel MISFET is substantially the same as the deposition thickness t2.

Specifically, according to the fourth embodiment, by reducing the thickness of the part of the silicon nitride film 14 (a compressive stress film for generating a compressive stress in a channel formation region of a MISFET) located on the gate electrode portion 20n including the gate electrode 6n and the on-gate slicide layer 12nA of the n-channel MISFET to a smaller thickness than that in the second embodiment, a compressive stress generated in the channel formation region of the n-channel MISFET can be weakened, compared to the second embodiment. Accordingly, reduction in a driving power of the n-channel MISFET can be suppressed while a driving power of the p-channel MISFET is improved.

Hereafter, a method for fabricating a semiconductor device according to the fourth embodiment will be described.

FIGS. 10A through 10F are cross-sectional views illustrating respective steps of the method for fabricating semiconductor device according to the fourth embodiment. In FIGS. 10A through 10F, each member also shown in FIGS. 6A through 6E in the second embodiment is identified by the same reference numeral and therefore the description thereof will be appropriately omitted.

Figure 6A:
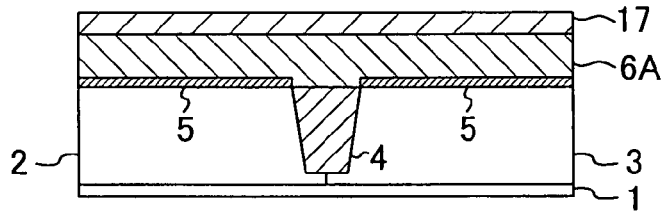
FIGS. 6A through 6E are cross-sectional views illustrating respective steps of a method for fabricating a semiconductor device according to the second embodiment of the present invention.
Figure 6B:
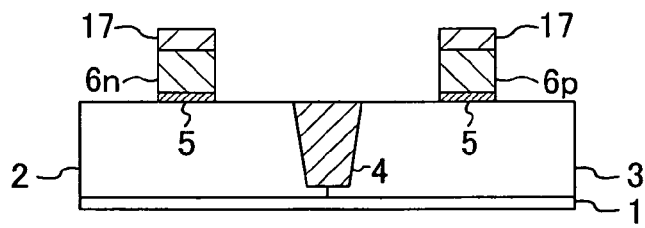
Figure 6C:
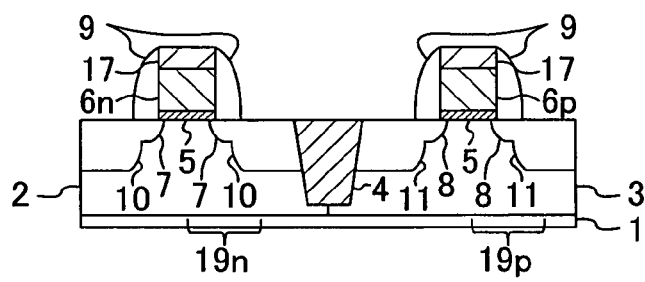
Figure 6D:
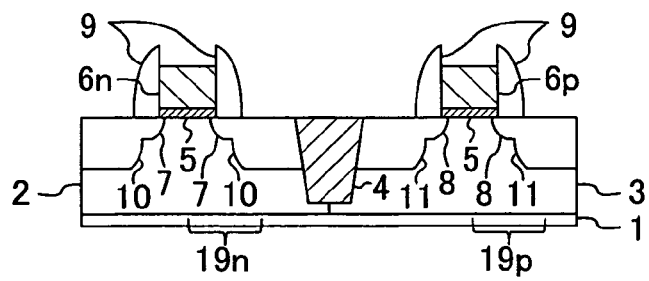
Figure 6E:
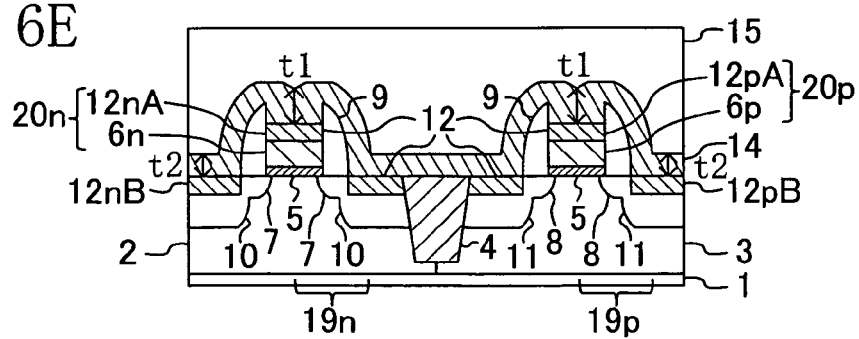
Figure 10A:
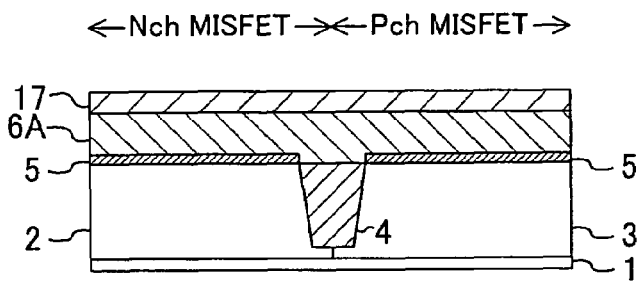
FIGS. 10A through 10F are cross-sectional views illustrating respective steps of a method for fabricating a semiconductor device according to the fourth embodiment of the present invention.

In the fourth embodiment, as shown in FIG. 10A, process steps up to the step of forming a silicon oxide film 17 serving as a hard mask used in gate patterning on a polycrystalline silicon film 6A are performed in the same manner as shown in FIG. 6A in the second embodiment.

Figure 10B:
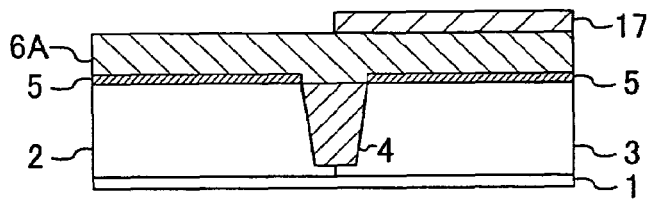

Next, as shown in FIG. 10B, with a p-channel MISFET formation region covered by a resist mask (not shown), etching is performed to selectively remove part of the silicon oxide film 17 located on an n-channel MISFET formation region. Thereafter, the resist mask is removed.

Figure 10C:
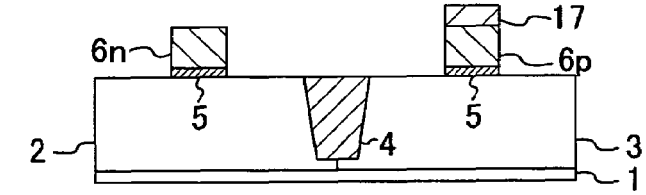

Next as shown in FIG. 10C, after lithography and etching have been performed, part of the polycrystalline silicon film 6A located on the n-MISFET formation region and parts of the silicon oxide film 17 and the polycrystalline silicon film 6A located over the p-channel MISFET formation region are patterned, thereby forming a gate electrode 6n and a gate electrode 6p on the n-channel MISFET formation region and the p-channel MISFET formation region, respectively. At this point, the silicon oxide film 17 remains on the gate electrode 6p in the p-channel MISFET formation region.

Figure 10D:
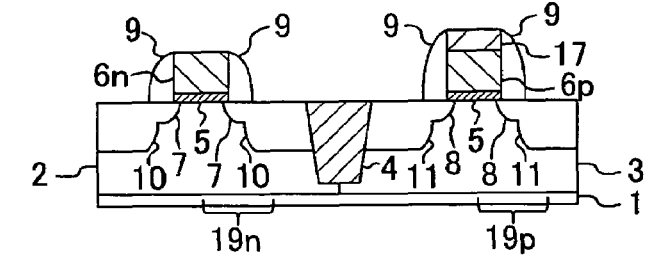

Next, as shown in FIG. 10D, as an n-type impurity, for example, arsenic (As) is selectively introduced by ion implantation to part of a p-type well region 2 on which the gate electrode 6n is not formed. Thus, a pair of n-type semiconductor regions (extension regions) 7 is formed. Thereafter, as a p-type impurity, for example, boron difluoride ($BF_2$) is selectively introduced by ion implantation to part of an n-type well region 3 on which the gate electrode 6p is not formed. Thus, a pair of p-type semiconductor regions (extension regions) 8 is formed. Formation of the n-type semiconductor regions 7 is performed with the p-channel MISFET formation region covered by a photoresist mask. Formation of the p-type semiconductor regions 8 is performed with the n-channel MISFET formation region covered by a photoresist mask.

Next, sidewall spacers 9 are formed on respective side surfaces of the gate electrode 6n of the n-channel MISFET formation region and respective side surfaces of the gate electrode 6p of the p-channel MISFET formation region and the silicon oxide film 17 located on the gate electrode 6p so that each of the insulating sidewall spacers 9 has a thickness of about 30-60 nm in the gate length direction. The sidewall spacers 9 are formed by forming an insulating film of, for example, a silicon nitride film over the p-type substrate 1 by CVD and then performing anisotropy etching such as RIE (reactive ion etching) and the like to the insulating film. Subsequently, as an n-type impurity, for example, arsenic (As) is selectively introduced by ion implantation to part of the p-type well region 2 on which the gate electrode 6n and the insulating sidewall spacers 9 are not formed. Thus, a pair of n-type semiconductor regions 10 is formed. Then, as a p-type impurity, for example, boron difluoride ($BF_2$) is selectively introduced to part of the n-type well region 3 on which the gate electrode 6p and the insulating sidewall spacers 9 are not formed. Thus, a pair of p-type semiconductor regions 11 is formed. Formation of the n-type semiconductor regions 10 is performed with the p-channel MISFET formation region covered by a photoresist mask. Formation of the p-channel MISFET semiconductor regions 11 is performed with the n-channel MISFET formation region covered by a photoresist mask. In the manner shown in FIG. 10D, n-type source/drain regions 19n of the n-channel MISFET each of which includes an associated one of the n-type semiconductor regions 7 and an associated one of the n-type semiconductor regions 10 are formed, and p-type source/drain regions 19p of the p-channel MISFET each of which includes an associated one of the p-type semiconductor regions 8 and an associated one of the p-type semiconductor regions 11 are formed.

Figure 10E:
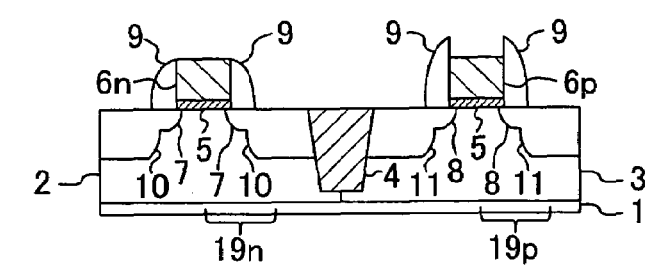

Next, as shown in FIG. 10E, wet treatment, for example, using a HF solution or the like is performed, thereby removing the silicon oxide film 17 formed on the gate electrode 6p of the p-channel MISFET formation region, native oxide formed on the n-type semiconductor regions 10 and the p-type semiconductor regions 11, and the like. Thus, respective surfaces of the gate electrodes 6n and 6p, the n-type semiconductor regions 10 and the p-type semiconductor regions 11 are exposed. As a result, as shown in FIG. 10E, a recess surrounded by upper portions of the sidewall spacers 9 is formed only on the gate electrode 6p. In other words, a recess surrounded by upper portions of the sidewall spacers 9 is not formed on the gate electrode 6n of the n-channel MISFET formation region.

Figure 10F:
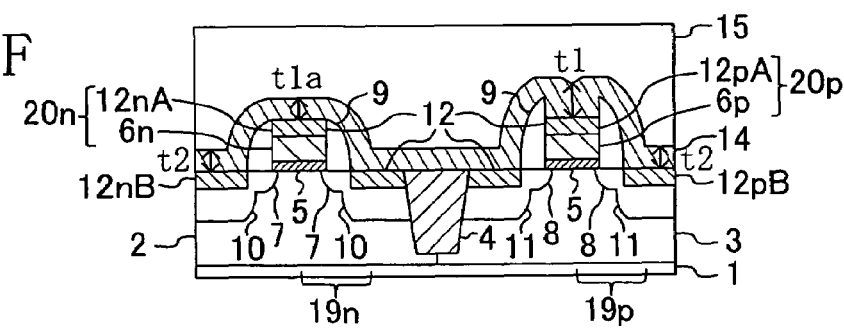

Next, as a refractory metal film, for example, a nickel (Ni) film is formed over the p-type substrate 1 by sputtering. Thereafter, heat treatment is performed. Thus, as shown in FIG. 10F, silicon (Si) in the gate electrodes 6n and 6p of the MISFETs and Ni in the nickel film are brought into reaction with one another, thereby forming on-gate silicide (NiSi) layers 12nA and 12pA on respective surfaces of the gate electrodes 6n and 6p, and Si in the semiconductor regions 10 and 11 and Ni in the nickel film are brought into reaction with one another, thereby forming on-source/drain silicide (NiSi) layers 12nB and 12pB on respective surfaces of the semiconductor regions 10 and 11. Thereafter, unreacted nickel film remaining on other regions of the substrate than the regions on which the silicide layer 12 is formed is selectively removed and then heat treatment is performed to activate the silicide layer 12. Thus, the gate electrode portion 20n of the n-channel MISFET including the gate electrode 6n and the on-gate slicide layer 12nA and the gate electrode portion 20p of the p-channel MISFET including the gate electrode 6p and the on-gate silicide layer 12pA are formed.

Next, a silicon nitride film 14 having a compressive stress is formed over the p-type substrate 1, for example, by high density plasma CVD (HDP-CVD). As deposition conditions for forming the silicon nitride film 14, for example, a high-frequency power is 600-700 W and a pressure inside a chamber is 5-10 Torr (665-1330 Pa).

In this embodiment, the deposition thickness t2 of the silicon nitride film 14 is set to be equal to or larger than half of a minimum gate length of the MISFETs formed on active regions. In this case, due to the existence of a recess surrounded by upper portions of wall spacers 9 on the gate electrode portion 20p, the thickness t1 of the part of the silicon nitride film 14 located on a center portion of the gate electrode portion 20p of the p-channel MISFET having the minimum gate length becomes larger than the deposition thickness t2 in a self-aligning manner. On the other hand, since a recess surrounded by upper surfaces of the sidewall spacers 9 does not exist on the gate electrode portion 20n, the thickness t1a of part of the silicon nitride film 14 located on the gate electrode portion 20n of the n-channel MISFET is substantially the same as the deposition thickness t2.

With the above-described structure, according to this embodiment, a compressive stress applied in the channel formation region of the p-channel MISFET can be made larger than a compressive stress applied in the channel formation region of the n-channel MISFET. As a result, the driving power of the p-channel MISFET can be improved and reduction in the driving power of the n-channel MISFET can be suppressed.

Next, an interlevel insulating film 15 of, for example, a silicon oxide film is formed over the p-type substrate 1 by plasma CVD and then a surface of the interlevel insulting film 15 is flattened by CMP. Thereafter, although not shown in the drawings, a contact hole(s), a metal interconnect layer(s) and the like are formed using a known technique to complete fabrication of the semiconductor device of this embodiment.

In the fourth embodiment, the polycrystalline silicon film 6A is used as a material of the gate electrodes 6n and 6p. However, instead of the polycrystalline silicon film 6A, some other conductive material may be used. Moreover, in this embodiment, the silicon oxide film 17 is formed on the polycrystalline silicon film 6A. Instead of forming the silicon oxide film 17, a protective film made of some other material may be formed.

In the fourth embodiment, the deposition thickness t2 itself of the silicon nitride film 14 can be controlled to be a thickness with which contact failure is prevented. This is the same effect as that of the first embodiment shown in FIGS. 4A through 4D.

Fifth Embodiment

Hereafter, a semiconductor device according to a fifth embodiment of the present invention and a method for fabricating the semiconductor device will be described. Specifically, as an example of application of the fifth embodiment, a semiconductor device having complementary MISFETs with a minimum gate length of 0.1 µm or less will be described in detail with reference to the accompanying drawings. This embodiment corresponds to a modified example of the first embodiment and the second embodiment and an objective of this embodiment is to improve respective driving powers of an n-channel MISFET and a p-channel MISFET by using different stress films (for example, liner nitride films) for the n-channel MISFET and the p-channel MISFET, respectively.

Figure 11:
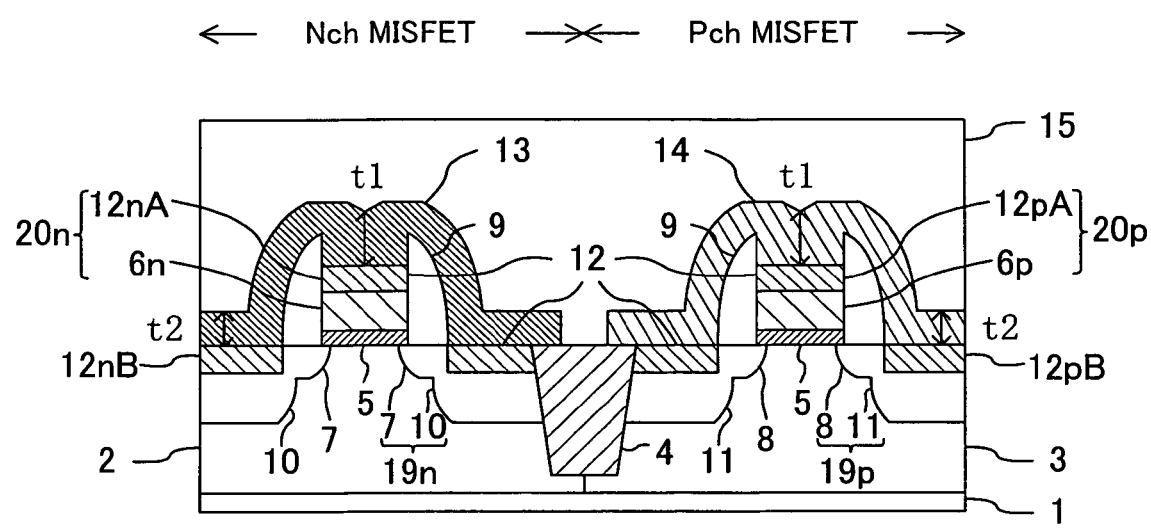
FIG. 11 is a cross-sectional view of a semiconductor device according to a fifth embodiment of the present invention.

FIG. 11 is a cross-sectional view illustrating a schematic structure of a semiconductor device according to the fifth embodiment. In FIG. 11, each member also shown in FIG. 1 in the first embodiment and FIG. 5 in the second embodiment is identified by the same reference numeral and therefore the description thereof will be appropriately omitted.

As shown in FIG. 11, as in the first embodiment, also in the semiconductor device of this embodiment, respective heights of an electrode portion 20n of an n-channel MISFET and an gate electrode portion 20p of a p-channel MISFET are smaller than heights of upper edges of sidewall spacers 9 provided on side surfaces of the gate electrode portions 20n and 20p. In other words, a recess surrounded by upper portions of the sidewall spacers 9 exists on each of the gate electrode portion 20n of the n-channel MISFET and the gate electrode portion 20p of the p-channel MISFET.

The fifth embodiment is different from the first embodiment in that, as shown in FIG. 11, while a silicon nitride film 13 serving as a tensile stress film is formed between an interlevel insulating film 15 and each of a gate electrode portion 20n of an n-channel MISFET and n-type semiconductor regions 10 (an on-source/drain silicide layer 12nB), a silicon nitride film 14 serving as a compressive stress film is formed between the interlevel insulating film 15 and each of a gate electrode portion 20p of a p-channel MISFET and p-type semiconductor regions 11 (an on-source/drain silicide layer 12pB).

In the above-described structure of this embodiment, as in the first embodiment, a thickness t1 of part of a silicon nitride film 13 located on the gate electrode portion 20n of the n-channel MISFET is larger than a thickness (deposition thickness t2) of other part of the silicon nitride film 13 (for example, the on-source/drain silicide layers 12nB and 12pB). Also, as in the second embodiment, a thickness t1 of part of the silicon nitride film 14 located on the gate electrode portion 20p of the p-channel MISFET is larger than a thickness (deposition thickness t2) of other part of the silicon nitride film 14. Thus, a tensile stress generated in a channel formation region of the n-channel MISFET can be selectively strengthened and a compressive stress generated in a channel formation region of the p-channel MISFET can be selectively strengthened. Therefore, respective driving powers of the n-channel MISFET and the p-channel MISFET can be improved.

Hereafter, a method for fabricating a semiconductor device according to the fifth embodiment will be described.

FIGS. 12A through 12F are cross-sectional views illustrating respective steps of the method for fabricating the semiconductor device according to the fifth embodiment. In FIGS. 12A through 12F, each member also shown in FIGS. 3A through 3E in the first embodiment and FIGS. 6A through 6E in the second embodiment is identified by the same reference numeral and therefore the description thereof will be appropriately omitted.

Figure 12A:
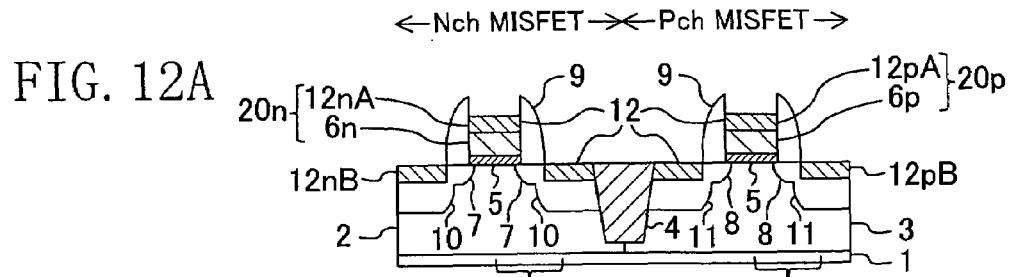
FIGS. 12A through 12F are cross-sectional views illustrating respective steps of a method for fabricating a semiconductor device according to the fifth embodiment of the present invention.

In the fifth embodiment, first, as shown in FIG. 12A, the step of forming an n-channel MISFET, the step of forming a p-channel MISFET and the step of forming a silicide layer 12 are performed in the same manner as shown in FIGS. 3A through 3E. At this point, a recess surrounded by upper portions of sidewall spacers 9 exists on each of the gate electrode portion 20n of the n-channel MISFET and a gate electrode portion 20p of the p-channel MISFET.

Figure 12B:
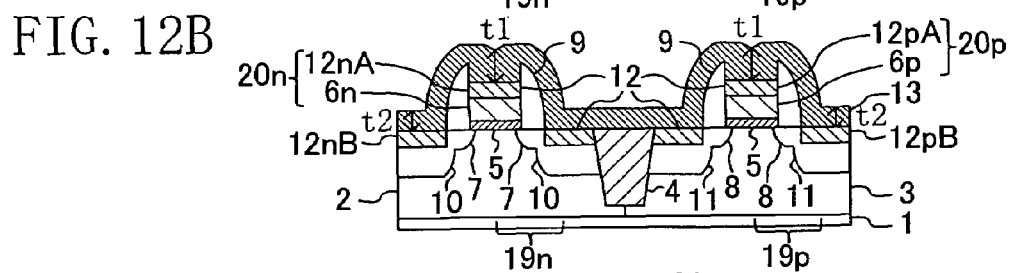

Next, as shown in FIG. 12B, a silicon nitride film 13 serving as a tensile stress film is formed over the p-type substrate 1, for example, by sub-atmospheric pressure chemical vapor deposition (SA-CVD). As deposition conditions for forming the silicon nitride film 13, for example, a high-frequency power is 350-400 W and a pressure inside a chamber is 300-350 Torr (39.9-46.55 kPa).

In this embodiment, the deposition thickness t2 of the silicon nitride film 13 is set to be equal to or larger than half of a minimum gate length of the MISFETs formed on active regions. In this case, due to the existence of a recess surrounded by upper portions of wall spacers 9 on the gate electrode portion 20n, the thickness t1 of the part of the silicon nitride film 13 located on the gate electrode portion 20n of the n-channel MISFET having the minimum gate length becomes larger than the deposition thickness t2 in a self-aligning manner.

Figure 12C:
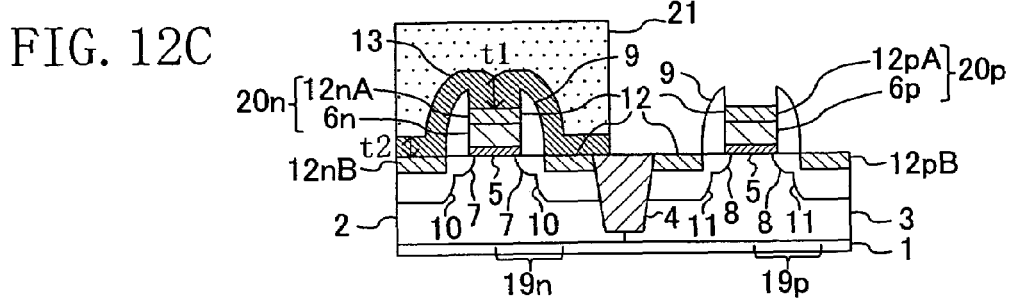

Next, as shown in FIG. 12C, using photolithography, a resist pattern 21 is formed over the silicon nitride film 13 so as to cover an n-channel MISFET formation region and, then using the resist pattern 21 as a mask, the silicon nitride film 13 is etched. Thus, only the n-channel MISFET formation region is selectively covered by the silicon nitride film 13. In other words, part of the silicon nitride film 13 located on the p-channel formation region is selectively removed. With the silicon nitride film 13 formed in the above-described manner, a tensile stress can be selectively generated only in the n-channel MISFET formation region. As a result, a driving power of the n-channel MISFET can be improved.

Figure 12D:
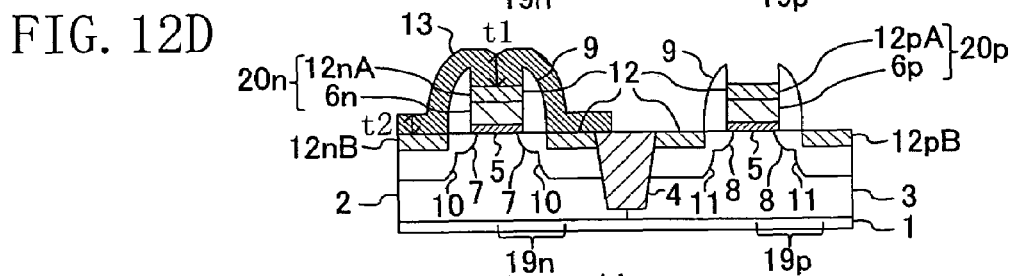
Figure 12E:
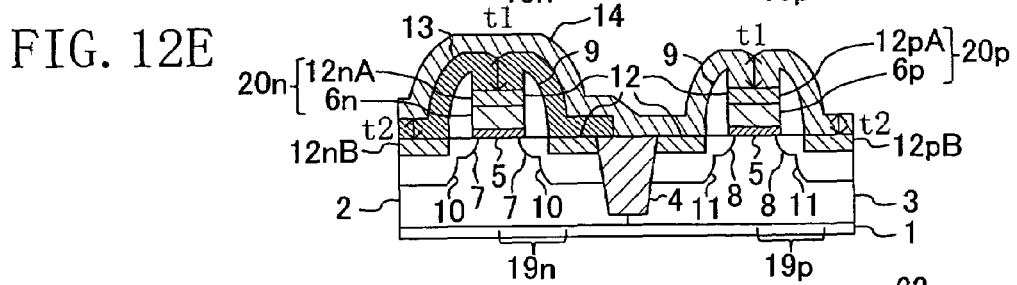

Next, as shown in FIG. 12D, after removal of the resist pattern 21, as shown in FIG. 12E, a silicon nitride film 14 serving as a compressive film is formed over the p-type substrate 1, for example, by high density plasma CVD (HDP-CVD). As deposition conditions for forming the silicon nitride film 14, for example, a high-frequency power is 600-700 W and a pressure inside a chamber is 5-10 Torr (665-1330 Pa).

In this embodiment, a deposition thickness t2 of the silicon nitride film 14 is set to be equal to or larger than half of a minimum gate length of the MISFETs formed on the active regions. In this case, due to the existence of a recess surrounded by upper portions of the sidewall spacers 9 on the gate electrode portion 20p, a thickness t1 of the silicon nitride film 14 located on the gate electrode portion 20p of the p-channel MISFET having a minimum gate length becomes larger than the deposition thickness t2 in a self aligning manner.

Figure 12F:
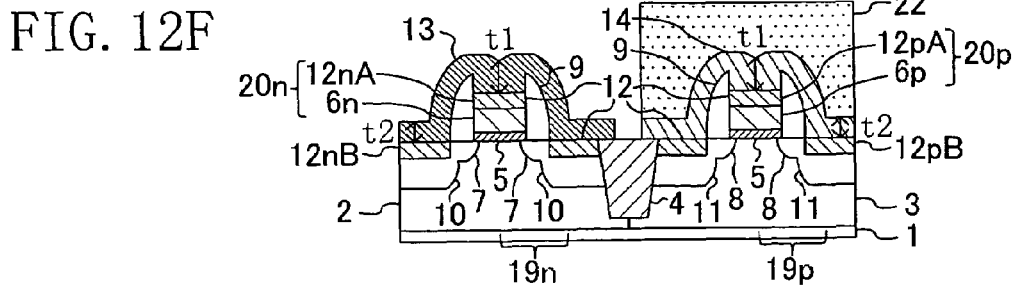

Next, as shown in FIG. 12F, using photolithography, a resist pattern 22 is formed over the silicon nitride film 14 so as to cover a p-channel MISFET formation region and then, using the resist pattern 22 as a mask, the silicon nitride film 14 is etched. Thus, only the p-channel MISFET formation region is selectively covered by the silicon nitride film 14. In other words, part of the silicon nitride film 14 located on the n-channel formation region is selectively removed. With the silicon nitride film 14 formed in the above-described manner, a compressive stress can be selectively generated only in the p-channel MISFET formation region. As a result, a driving power of the p-channel MISFET can be improved.

Next, although not shown in the drawings, after removal of the resist pattern 22, an interlevel insulating film 15 of, for example, a silicon oxide film is formed over the p-type substrate 1 by plasma CVD and then a surface of the interlevel insulting film 15 is flattened by CMP. Thereafter, although not shown in the drawings, a contact hole(s), a metal interconnect layer(s) and the like are formed using a known technique to complete fabrication of the semiconductor device of this embodiment.

In the fifth embodiment, the polycrystalline silicon film 6A is used as a material of the gate electrodes 6n and 6p. However, instead of the polycrystalline silicon film 6A, some other conductive material may be used. Moreover, in this embodiment, a silicon oxide film 17 is formed on the polycrystalline silicon film 6A. Instead of forming the silicon oxide film 17, a protective film made of some other material may be formed.

In the fifth embodiment, the deposition thickness t2 itself of each of the silicon nitride films 13 and 14 can be controlled to be a thickness with which contact failure is prevented (the deposition thickness t2 may differ between the silicon nitride films 13 and 14). This is the same effect as that of the first embodiment shown in FIGS. 4A through 4D.

Sixth Embodiment

Hereafter, a semiconductor device according to a sixth embodiment of the present invention and a method for fabricating the semiconductor device will be described. Specifically, as an example of application of the sixth embodiment, a semiconductor device having complementary MISFETs with a minimum gate length of 0.1 µm or less will be described in detail with reference to the accompanying drawings. This embodiment corresponds to a modified example of the third embodiment and is characterized in that a silicon germanium (which will be herein referred to as "SiGe") film is used for forming a recess surrounded by sidewall spacers on a gate electrode portion on an n-channel MISFET and a gate electrode of a p-channel MISFET has a two-layer structure of a polycrystalline film and a SiGe film, so that an S factor (S parameter) of a p-channel MISFET can be improved.

Figure 13:
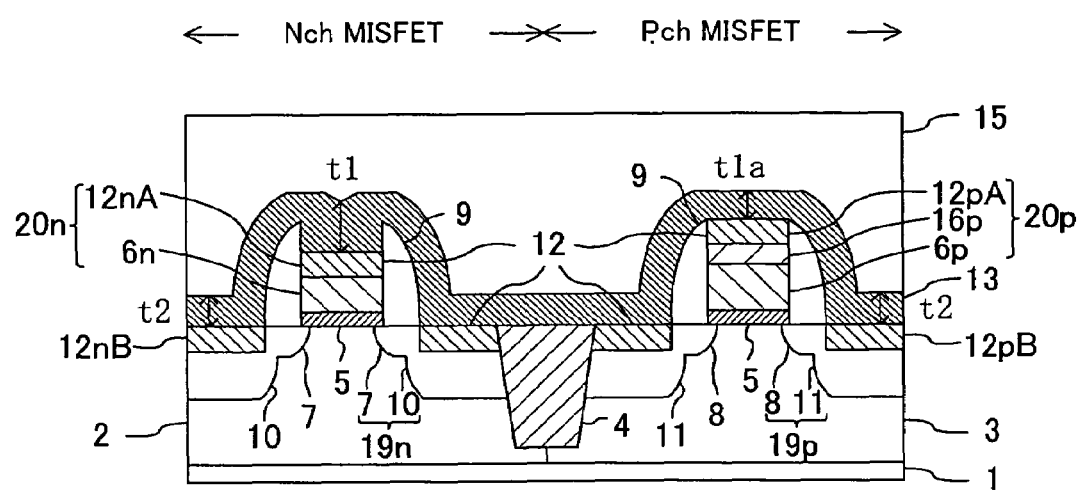
FIG. 13 is a cross-sectional view of a semiconductor device according to a sixth embodiment of the present invention.

FIG. 13 is a cross-sectional view illustrating a schematic structure of a semiconductor device according to the sixth embodiment. In FIG. 13, each member also shown in FIG. 7 in the third embodiment is identified by the same reference numeral and therefore the description thereof will be appropriately omitted.

The sixth embodiment is different from the third embodiment in that, as shown in FIG. 13, a SiGe film serving as a second gate electrode 16p is formed on a polycrystalline silicon film serving as a first gate electrode 6p of a p-channel MISFET, i.e., a gate electrode of the p-channel MISFET has a two-layer structure of a polycrystalline film and a SiGe film and, accordingly, a height of a gate electrode portion 20p including the first gate electrode 6p, the second gate electrode 16p and an on-gate silicide layer 12pA is equal to or larger than a height of an upper edge of each of sidewall spacers 9 provided on side surfaces of the gate electrode portion 20p. That is, a recess surrounded by upper portions of the sidewall spacers 9 does not exist on the gate electrode portion 20p of the p-channel MISFET. In contrast, a recess surrounded by upper portions of the sidewall spacers 9 exists on a gate electrode portion 20n of an n-channel MISFET including a first gate electrode 6n and an on-gate slicide layer 12nA. The height of an upper edge of each of the sidewall spacers 9 provided on side surfaces of the gate electrode portion 20p of the p-channel MISFET is substantially equal to a height of an upper edge of each of the sidewall spacers 9 provided on side surfaces of the gate electrode portion 20n of the n-channel MISFET.

In the above-described structure of this embodiment, as in the third embodiment, in contrast with a thickness t1 of part of a silicon nitride film 13 which is located on the gate electrode portion 20n of the n-channel MISFET is larger than a thickness (deposition thickness t2) of other part of the silicon nitride film 13 (for example, on-source/drain silicide layers 12nB and 12pB), a thickness t1a of part of the silicon nitride film 13 located on the gate electrode portion 20p of the p-channel MISFET is substantially the same as a deposition thickness t2.

Specifically, according to the sixth embodiment, by reducing the thickness of the part of the silicon nitride film 13 (a tensile stress film for generating a tensile stress in a channel formation region of a MISFET) located on the gate electrode portion 20p of the p-channel MISFET to a smaller thickness than that in the first embodiment, a tensile stress generated in the channel formation region of the p-channel MISFET can be weakened, compared to the first embodiment. Accordingly, reduction in a driving power of the p-channel MISFET can be suppressed while a driving power of the n-channel MISFET is improved.

According to the sixth embodiment, a gate electrode of a p-channel MISFET is formed so as to have a two-layer structure of a polycrystalline layer (first gate electrode 6) and a SiGe film (second gate electrode film 16). Thus, with the structure of this embodiment, compared to the case where a polycrystalline silicon film having a single-layer structure is used, the same threshold can be achieved with a lower concentration of an impurity introduced into a substrate. Therefore, the S factor of a p-channel MISFET can be improved.

Hereafter, a method for fabricating a semiconductor device according to the sixth embodiment will be described.

FIGS. 14A through 14E are cross-sectional views illustrating respective steps of the method for fabricating semiconductor device according to the sixth embodiment. In FIGS. 14A through 14E, each member also shown in FIGS. 8A through 8F in the third embodiment is identified by the same reference numeral and therefore the description thereof will be appropriately omitted.

Figure 14A:
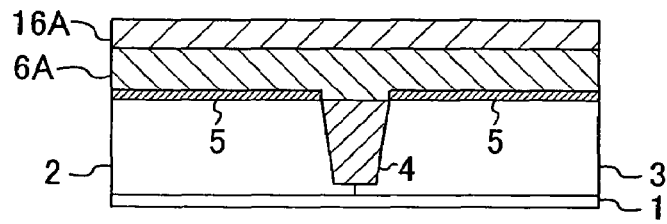
FIGS. 14A through 14E are cross-sectional views illustrating respective steps of a method for fabricating a semiconductor device according to the sixth embodiment of the present invention.

First, as shown in FIG. 14A, a p-type semiconductor substrate (which will be herein referred to merely as a "p-type substrate") formed of, for example, single crystalline silicon is prepared and then a p-type well region 2 and an n-type well region 3 are selectively formed on a principal surface of the p-type substrate 1. At this time, an impurity concentration in the n-type well region 3 is set to be lower than that in each of the first through fifth embodiments. Next, an isolation region 4 and a gate insulating film 5 are formed, for example, in the same manner as in the first embodiment, and then a polycrystalline silicon film 6A serving as a first gate electrode is formed over the p-type substrate 1 so as to have a thickness of, for example, 120 nm, for example, by CVD. Thereafter, a SiGe film 16A serving as a second gate electrode is deposited on the polycrystalline silicon film 6A so as to have a thickness of, for example, 20 nm.

Figure 14B:
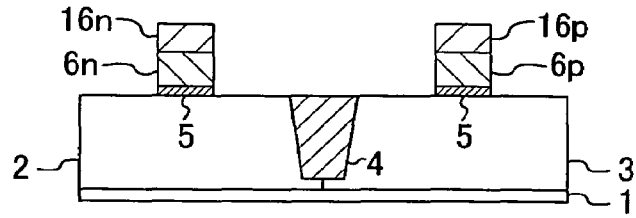

Next, as shown in FIG. 14B, after lithography and etching have been performed, the SiGe film 16A and the polycrystalline silicon film 6A are patterned, thereby forming a laminated structure of a first gate electrode 6n and a second gate electrode 16n in an n-channel MISFET formation region and a laminated structure of a first electrode 6p and a second gate electrode 16p in a p-channel MISFET formation region.

Figure 14C:
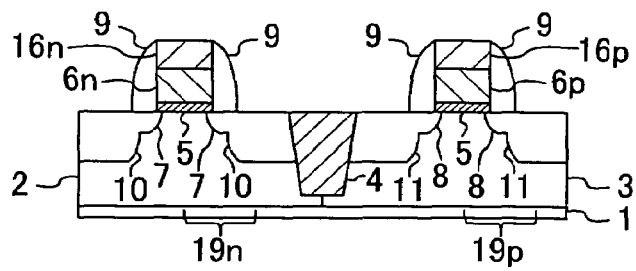

Next, as shown in FIG. 14C, as an n-type impurity, for example, arsenic (As) is selectively introduced by ion implantation to part of the p-type well region 2 on which the first gate electrode 6n and the second gate electrode 16n are not formed. Thus, a pair of n-type semiconductor regions (extension regions) 7 is formed. Thereafter, as a p-type impurity, for example, boron difluoride (BF$_2$) is selectively introduced by ion implantation to part of the n-type well region 3 on which the first gate electrode 6p and the second gate electrode 16p are not formed. Thus, a pair of p-type semiconductor regions (extension regions) 8 is formed. Formation of the n-type semiconductor regions 7 is performed with the p-channel MISFET formation region covered by a photoresist mask. Formation of the p-type semiconductor regions 8 is performed with the n-channel MISFET formation region covered by a photoresist mask.

Next, sidewall spacers 9 are formed on respective side surfaces of the first gate electrode 6n and the second gate electrode 16n of the n-channel MISFET formation region and respective side surfaces of the first gate electrode 6p and the second gate electrode 16p of the p-channel MISFET formation region so that each of the insulating sidewall spacers 9 has a thickness of, for example, about 30-60 nm in the gate length direction. The sidewall spacers 9 are formed by forming an insulating film of, for example, a silicon nitride film over the p-type substrate 1 by CVD and then performing anisotropy etching such as RIE (reactive ion etching) and the like to the insulating film. Subsequently, as an n-type impurity, for example, arsenic (As) is selectively introduced by ion implantation to part of the p-type well region 2 on which the first gate electrode 6n, the second gate electrode 16n and the insulating sidewall spacers 9 are not formed. Thus, a pair of n-type semiconductor regions 10 is formed. Then, as a p-type impurity, for example, boron difluoride ($BF_2$) is selectively introduced to part of the n-type well region 3 on which the first gate electrode 6p, the second gate electrode 16p and the insulating sidewall spacers 9 are not formed. Thus, a pair of p-type semiconductor regions 11 is formed. Formation of the n-type semiconductor regions 10 is performed with the p-channel MISFET formation region covered by a photoresist mask. Formation of the p-channel MISFET semiconductor regions 11 is performed with the n-channel MISFET formation region covered by a photoresist mask. In the manner shown in FIG. 14C, the n-type source/drain regions 19n of the n-channel MISFET each of which includes an associated one of the n-type semiconductor regions 7 and an associated one of the n-type semiconductor regions 10 are formed, and the p-type source/drain regions 19p of p-channel MISFET each of which includes an associated one of the p-type semiconductor regions 8 and an associated one of the p-type semiconductor regions 11 are formed.

Figure 14D:
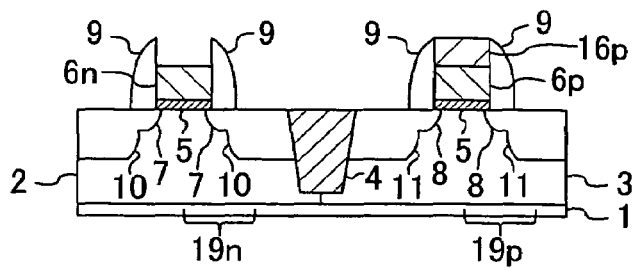

Next, as shown in FIG. 14D, with the p-channel MISFET formation region protected by the resist mask (not shown) formed, for example, by lithography, the second gate electrode (SiGe film) 16n of the n-channel MISFET is selectively removed using, for example, fluoronitric acid. As a result, as shown in FIG. 14D, a recess surrounded by upper portions of the sidewall spacers 9 is formed only on a gate electrode (i.e., a single-layer structure of the first gate electrode 6n) of the n-channel MISFET formation region. In other words, a recess surrounded by upper portions of the sidewall spacers 9 is not formed on a gate electrode (i.e., a laminated structure of the first gate electrode 6p and the second gate electrode 16p) of the p-channel MISFET formation region.

Figure 14E:
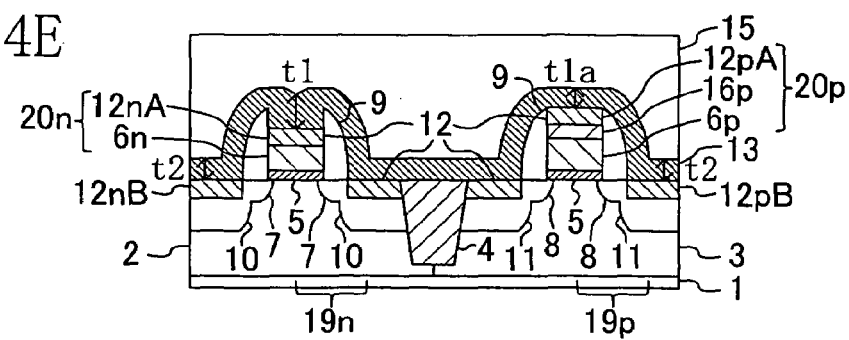

Next, as a refractory metal film, for example, a nickel (Ni) film is formed over the p-type substrate 1 by sputtering. Thereafter, heat treatment is performed. Thus, as shown in FIG. 14E, silicon (Si) in the first gate electrode 6n of the n-channel MISFET formation region and the second gate electrode 16p of the p-channel MISFET formation region and Ni in the nickel film are brought into reaction with one another, thereby forming on-gate silicide (NiSi) layers 12nA and 12pA on respective surfaces of the first gate electrode 6n of the n-channel MISFET formation region and the second gate electrode 16p of the p-channel MISFET formation region, and Si in the semiconductor regions 10 and 11 and Ni in the nickel film are brought into reaction with one another, thereby forming on-source/drain silicide (NiSi) layers 12nB and 12pB on respective surfaces of the semiconductor regions 10 and 11. Thereafter, unreacted nickel film remaining on other regions of the substrate than the regions on which the silicide layer 12 is formed is selectively removed and then heat treatment is performed to activate the silicide layer 12. Thus, the gate electrode portion 20n of the n-channel MISFET including the first gate electrode 6n and the on-gate silicide layer 12nA and the gate electrode portion 20p of the p-channel MISFET including the first gate electrode 6p, the second gate electrode 16p and the on-gate silicide layer 12pA are formed.

Next, a silicon nitride film 13 having a tensile stress is formed over the p-type substrate 1, for example, by sub-atmospheric pressure chemical vapor deposition (SA-CVD). As deposition conditions for forming the silicon nitride film 13, for example, a high-frequency power is 350-400 W and a pressure inside a chamber is 300-350 Torr (39.9-46.55 kPa).

In this embodiment, a deposition thickness t2 of the silicon nitride film 13 is set to be equal to or larger than half of a minimum gate length of the MISFETs formed on active regions. In this case, due to the existence of a recess surrounded by upper portions of the sidewall spacers 9 on the gate electrode portion 20n of the n-channel MISFET having a minimum gate length, a thickness t1 of part of the silicon nitride film 13 located on the gate electrode portion 20n of the n-channel MISFET having a minimum gate length is larger than the deposition thickness t2 in a self aligning manner. On the other hand, since a recess surrounded by upper surfaces of the sidewall spacers 9 does not exist on the gate electrode portion 20p, the thickness t1a of part of the silicon nitride film 13 located on the gate electrode portion 20p of the p-channel MISFET is substantially the same as the deposition thickness t2. With the above-described structure, according to this embodiment, a tensile stress applied in the channel formation region of the n-channel MISFET can be made larger than a tensile stress applied in the channel formation region of the p-channel MISFET. As a result, the driving power of the n-channel MISFET can be improved and reduction in the driving power of the p-channel MISFET can be suppressed.

Next, an interlevel insulating film 15 of, for example, a silicon oxide film is formed over the p-type substrate 1 by plasma CVD and then a surface of the interlevel insulting film 15 is flattened by CMP. Thereafter, although not shown in the drawings, a contact hole(s), a metal interconnect layer(s) and the like are formed using a known technique to complete fabrication of the semiconductor device of this embodiment.

In the sixth embodiment, the polycrystalline silicon film 6A is used as a material of the first gate electrodes 6n and 6p. However, instead of the polycrystalline silicon film 6A, some other conductive material may be used. Also, the SiGe film 16A is used as a material of the second gate electrodes 16n and 16p. However, instead of the SiGe film 16A, some other conductive material which is different from the material of the first gate electrodes 6n and 6p may be used. Moreover, a two-layer structure of a polycrystalline silicon film and a SiGe film is used as a gate electrode structure. However, instead of the two-layer structure, a stacked layer structure in which three or more layers are stacked may be used. In such a case, a multilayer structure having a smaller height than a height of the p-channel MISFET may be used as a gate electrode structure of the n-channel MISFET.

In the sixth embodiment, the deposition thickness t2 itself of the silicon nitride film 13 can be controlled to be a thickness with which contact failure is prevented. This is the same effect as that of the first embodiment shown in FIGS. 4A through 4D.

Seventh Embodiment

Hereafter, a semiconductor device according to a seventh embodiment of the present invention and a method for fabricating the semiconductor device will be described. Specifically, as an example of application of the seventh embodiment, a semiconductor device having complementary MISFETs with a minimum gate length of 0.1 μm or less will be described in detail with reference to the accompanying drawings. This embodiment corresponds to a modified example of the fourth embodiment and is characterized in that a silicon germanium (which will be herein referred to as "SiGe") film is used for forming a recess surrounded by sidewall spacers on a gate electrode portion on a p-channel MISFET and a gate electrode of an n-channel MISFET has a two-layer structure of a polycrystalline layer and a SiGe film, so that an S factor (S parameter) of an n-channel MISFET can be improved.

Figure 15:
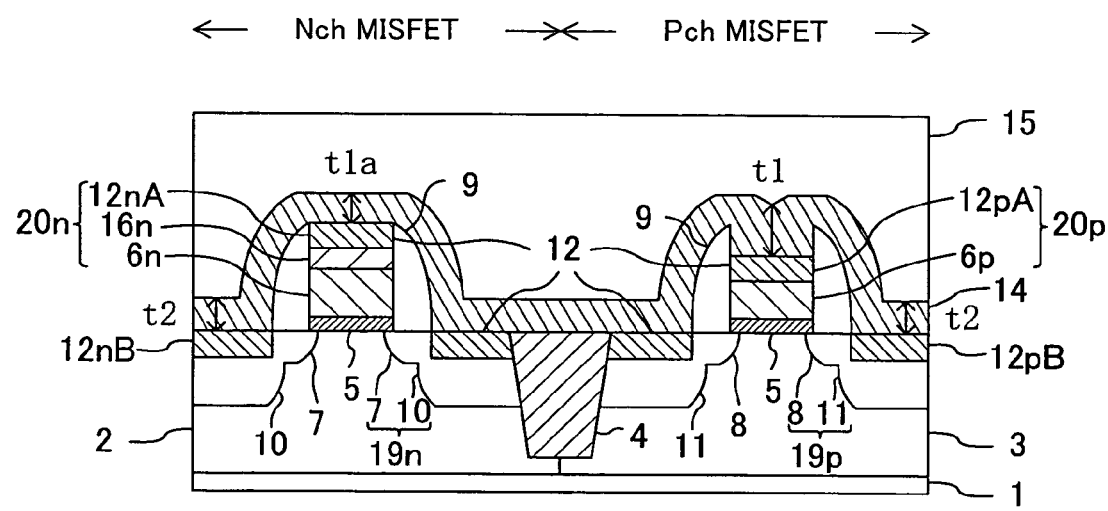
FIG. 15 is a cross-sectional view of a semiconductor device according to a seventh embodiment of the present invention.

FIG. 15 is a cross-sectional view illustrating a schematic structure of a semiconductor device according to the seventh embodiment. In FIG. 15, each member also shown in FIG. 9 in the fourth embodiment is identified by the same reference numeral and therefore the description thereof will be appropriately omitted.

The seventh embodiment is different from the fourth embodiment in that, as shown in FIG. 15, a SiGe film serving as a second gate electrode 16n is formed on a polycrystalline silicon film serving as a first gate electrode 6n of an n-channel MISFET. That is, a gate electrode of the n-channel MISFET has a two-layer structure of a polycrystalline film and a SiGe film and, accordingly, a height of a gate electrode portion 20n including the first gate electrode 6n, the second gate electrode 16n and an on-gate silicide layer 12nA is equal to or larger than a height of an upper edge of each of sidewall spacers 9 provided on side surfaces of the gate electrode portion 20n. Specifically, a recess surrounded by upper portions of the sidewall spacers 9 does not exist on the gate electrode portion 20n of the n-channel MISFET. In contrast, a recess surrounded by upper portions of the sidewall spacers 9 exists on a gate electrode portion 20p of a p-channel MISFET including a first gate electrode 6p and an on-gate slicide layer 12pA. The height of an upper edge of each of the sidewall spacers 9 provided on side surfaces of the gate electrode portion 20p of the p-channel MISFET is substantially equal to a height of an upper edge of each of the sidewall spacers 9 provided on side surfaces of the gate electrode portion 20n of the n-channel MISFET.

In the above-described structure of this embodiment, as in the fourth embodiment, in contrast with a thickness t1 of part of a silicon nitride film 14 which is located on the gate electrode portion 20p of the p-channel MISFET and is larger than a thickness (deposition thickness t2) of other part of the silicon nitride film 14 (for example, on-source/drain silicide layers 12nB and 12pB), a thickness t1a of part of the silicon nitride film 14 located on the gate electrode portion 20n of the n-channel MISFET is substantially the same as a deposition thickness t2.

Specifically, according to the seventh embodiment, by reducing the thickness of the part of the silicon nitride film 14 (a compressive stress film for generating a compressive stress in a channel formation region of a MISFET) located on the gate electrode portion 20n of the n-channel MISFET to a smaller thickness than that in the second embodiment, a compressive stress generated in the channel formation region of the n-channel MISFET can be weakened, compared to the second embodiment. Accordingly, reduction in a driving power of the n-channel MISFET can be suppressed while a driving power of the p-channel MISFET is improved.

According to the seventh embodiment, a gate electrode of an n-channel MISFET is formed so as to have a two-layer structure of a polycrystalline layer (first gate electrode 6n) and a SiGe film (second gate electrode film 16n). Thus, with the structure of this embodiment, compared to the case where a gate electrode of a polycrystalline silicon film having a single-layer structure is used, the same threshold voltage can be achieved with a lower concentration of an impurity introduced into a substrate. Therefore, the S factor of the n-channel MISFET can be improved.

Hereafter, a method for fabricating a semiconductor device according to the seventh embodiment will be described.

FIGS. 16A through 16E are cross-sectional views illustrating respective steps of the method for fabricating semiconductor device according to the seventh embodiment. In FIGS. 16A through 16E, each member also shown in FIGS. 10A through 10F in the fourth embodiment is identified by the same reference numeral and therefore the description thereof will be appropriately omitted.

Figure 16A:
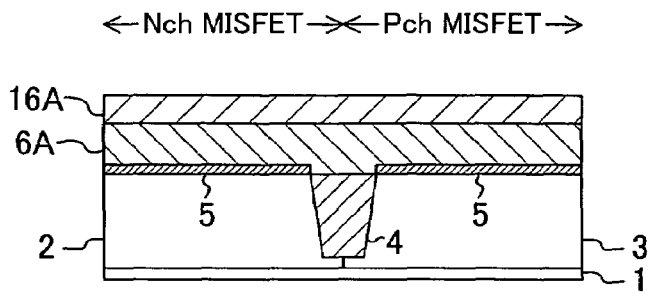
FIGS. 16A and 16E are cross-sectional views illustrating respective steps of a method for fabricating a semiconductor device according to the seventh embodiment of the present invention.

First, as shown in FIG. 16A, a p-type semiconductor substrate (which will be herein referred to merely as a "p-type substrate") formed of, for example, single crystalline silicon is prepared and then a p-type well region 2 and an n-type well region 3 are selectively formed on a principal surface of the p-type substrate 1. At this time, an impurity concentration in the p-type well region 2 is set to be lower than that in each of the first through fifth embodiments. Next, an isolation region 4 and a gate insulating film 5 are formed in the same manner as in the second embodiment, and then a polycrystalline silicon film 6A serving as a first gate electrode is formed over the p-type substrate 1 so as to have a thickness of, for example, 120 nm, for example, by CVD. Thereafter, a SiGe film 16A serving as a second gate electrode is deposited on the polycrystalline silicon film 6A so as to have a thickness of, for example, 20 nm.

Figure 16B:
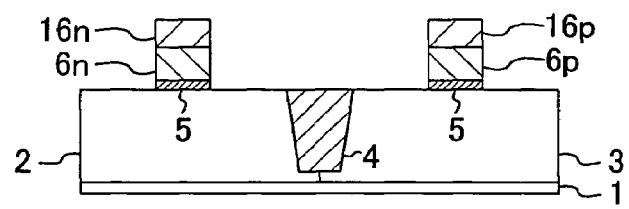

Next, as shown in FIG. 16B, after lithography and etching have been performed, the SiGe film 16A and the polycrystalline silicon film 6A are patterned, thereby forming a laminated structure of a first gate electrode 6n and a second gate electrode 16n in an n-channel MISFET formation region and a laminated structure of a first electrode 6p and a second gate electrode 16p in a p-channel MISFET formation region.

Figure 16C:
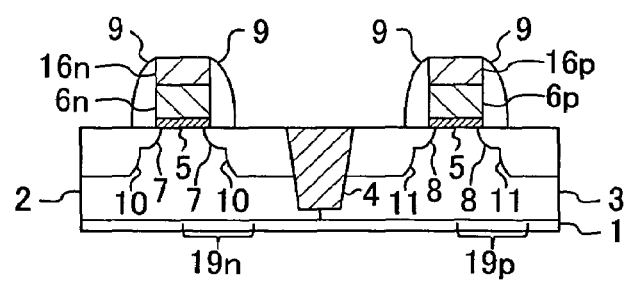

Next, as shown in FIG. 16C, as an n-type impurity, for example, arsenic (As) is selectively introduced by ion implantation to part of the p-type well region 2 on which the first gate electrode 6n and the second gate electrode 16n are not formed. Thus, a pair of n-type semiconductor regions (extension regions) 7 is formed. Thereafter, as a p-type impurity, for example, boron difluoride ($BF_2$) is selectively introduced by ion implantation to part of the n-type well region 3 on which the first gate electrode 6p and the second gate electrode 16p are not formed. Thus, a pair of p-type semiconductor regions (extension regions) 8 is formed. Formation of the n-type semiconductor regions 7 is performed with the p-channel MISFET formation region covered by a photoresist mask. Formation of the p-type semiconductor regions 8 is performed with the n-channel MISFET formation region covered by a photoresist mask.

Next, sidewall spacers 9 are formed on respective side surfaces of the first gate electrode 6n and the second gate electrode 16n of the n-channel MISFET formation region and respective side surfaces of the first gate electrode 6p and the second gate electrode 16p of the p-channel MISFET formation region, for example, so that each of the insulating sidewall spacers 9 has a thickness of about 30-60 nm in the gate length direction. The sidewall spacers 9 are formed by forming an insulating film of, for example, a silicon nitride film over the p-type substrate 1 by CVD and then performing anisotropy etching such as RIE and the like to the insulating film. Subsequently, as an n-type impurity, for example, arsenic (As) is selectively introduced by ion implantation to part of the p-type well region 2 on which the first gate electrode 6n, the second gate electrode 16n and the insulating sidewall spacers 9 are not formed. Thus, a pair of n-type semiconductor regions 10 is formed. Then, as a p-type impurity, for example, boron difluoride ($BF_2$) is selectively introduced to part of the n-type well region 3 on which the first gate electrode 6p, the second gate electrode 16p and the insulating sidewall spacers 9 are not formed. Thus, a pair of p-type semiconductor regions 11 is formed. Formation of the n-type semiconductor regions 10 is performed with the p-channel MISFET formation region covered by a photoresist mask. Formation of the p-channel MISFET semiconductor regions 11 is performed with the n-channel MISFET formation region covered by a photoresist mask. In the manner shown in FIG. 16C, the n-type source/drain regions 19n of the n-channel MISFET each of which includes an associated one of the n-type semiconductor regions 7 and an associated one of the n-type semiconductor regions 10 are formed, and the p-type source/drain regions 19p of p-channel MISFET each of which includes an associated one of the p-type semiconductor regions 8 and an associated one of the p-type semiconductor regions 11 are formed.

Figure 16D:
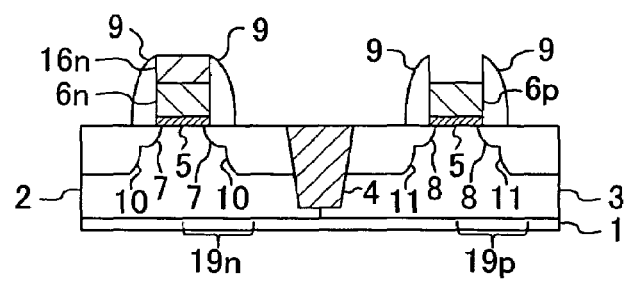

Next, as shown in FIG. 16D, with the n-channel MISFET formation region protected by the resist mask (not shown) formed, for example, by lithography, the second gate electrode (SiGe film) 16p of the p-channel MISFET is selectively removed using, for example, fluoronitric acid. As a result, as shown in FIG. 16D, a recess surrounded by upper portions of the sidewall spacers 9 is formed only on a gate electrode (i.e., a single-layer structure of the first gate electrode 6p) of the p-channel MISFET formation region. In other words, a recess surrounded by upper portions of the sidewall spacers 9 is not formed on a gate electrode (i.e., a laminated structure of the first gate electrode 6n and the second gate electrode 16n) of the n-channel MISFET formation region.

Figure 16E:
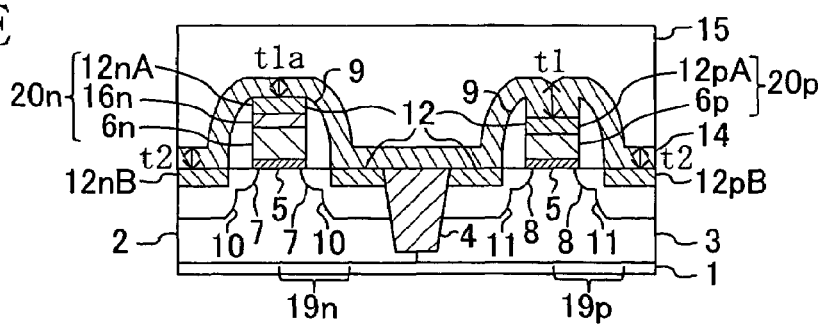
Figure 17A:
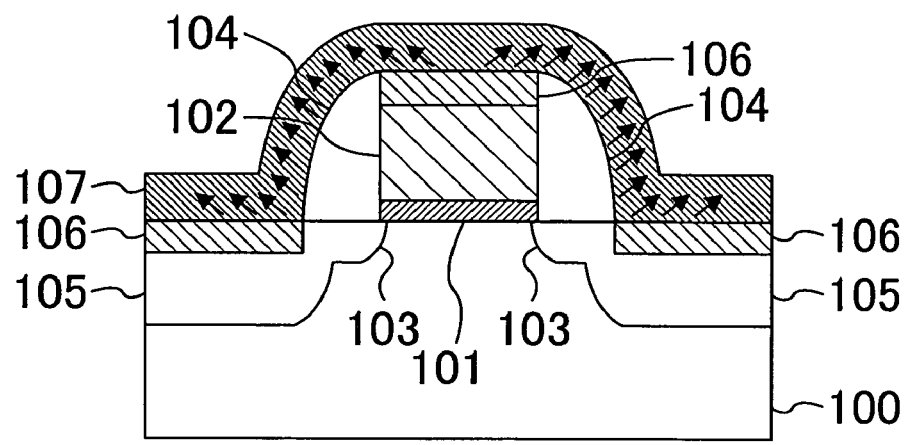
FIG. 17A is a view illustrating how a tensile stress film for generating a tensile stress in a channel region is formed.
Figure 17B:
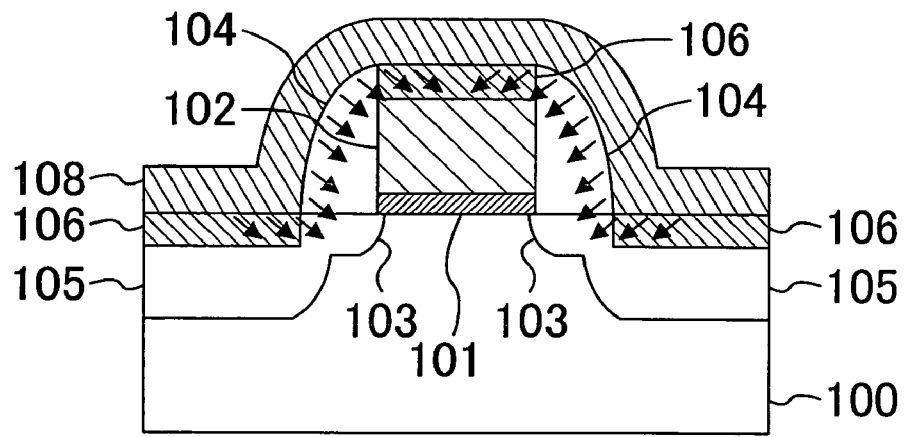
FIG. 17B is a view illustrating how a compressive stress for generating a compressive stress in a channel region is formed.
Figure 18A:
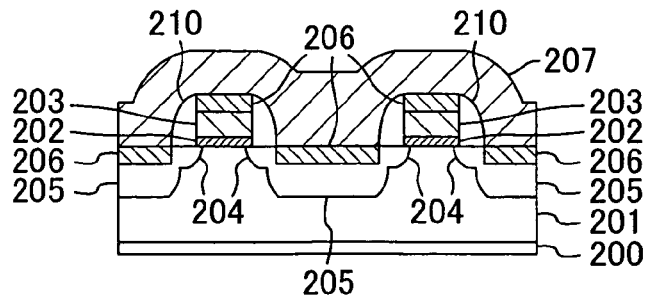
FIGS. 18A through 18D are cross-sectional views illustrating respective steps of a known method for fabricating a semiconductor device.
Figure 18B:
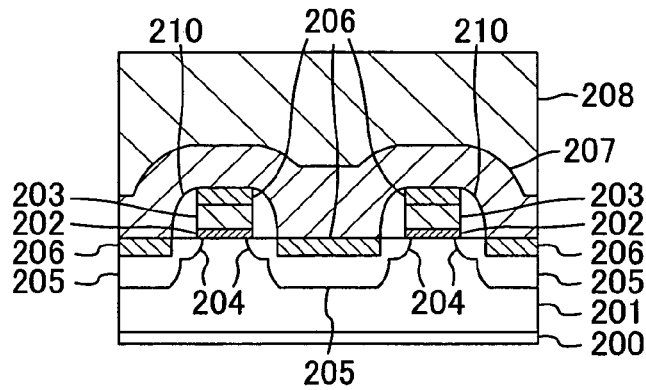
Figure 18C:
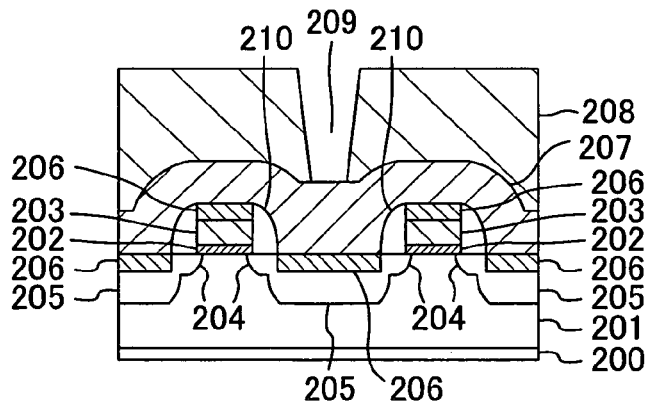
Figure 18D:
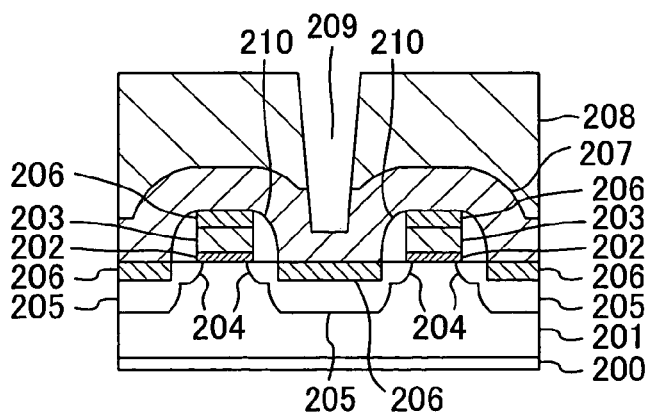

Next, as a refractory metal film, for example, a nickel (Ni) film is formed over the p-type substrate 1 by sputtering. Thereafter, heat treatment is performed. Thus, as shown in FIG. 16E, silicon (Si) in the second gate electrode 16n of the n-channel MISFET formation region and the first gate electrode 6p of the p-channel MISFET formation region and Ni in the nickel film are brought into reaction with one another, thereby forming on-gate silicide (NiSi) layers 12nA and 12pA on respective surfaces of the second gate electrode 16n of the n-channel MISFET formation region and the first gate electrode 6p of the p-channel MISFET formation region, respectively, and Si in the semiconductor regions 10 and 11 and Ni in the nickel film are brought into reaction with one another, thereby forming on-source/drain silicide (NiSi) layers 12nB and 12pB on respective surfaces of the semiconductor regions 10 and 11. Thereafter, unreacted nickel film remaining on other regions of the substrate than the regions on which the silicide layer 12 is formed is selectively removed and then heat treatment is performed to activate the silicide layer 12. Thus, the gate electrode portion 20n of the n-channel MISFET including the first gate electrode 6n, the second gate electrode 16n and the on-gate silicide layer 12nA and the gate electrode portion 20p of the p-channel MISFET including the first gate electrode 6p and the on-gate silicide layer 12pA are formed.

Next, a silicon nitride film 14 having a compressive stress is formed over the p-type substrate 1, for example, by high density plasma CVD (HDP-CVD). As deposition conditions for forming the silicon nitride film 14, for example, a high-frequency power is 600-700 W and a pressure inside a chamber is 5-10 Torr (665-1330 Pa).

In this embodiment, the deposition thickness t2 of the silicon nitride film 14 is set to be equal to or larger than half of a minimum gate length of the MISFETs formed on active regions. In this case, due to the existence of a recess surrounded by upper portions of wall spacers 9 on the gate electrode portion 20p, the thickness t1 of the part of the silicon nitride film 14 located on the gate electrode portion 20p of the p-channel MISFET is larger than the deposition thickness t2 in a self-aligning manner. On the other hand, since a recess surrounded by upper surfaces of the sidewall spacers 9 does not exist on the gate electrode portion 20n, the thickness t1a of part of the silicon nitride film 14 located on the gate electrode portion 20n of the n-channel MISFET is substantially the same as the deposition thickness t2. With the above-described structure, according to this embodiment, a compressive stress applied in the channel formation region of the p-channel MISFET can be made larger than a compressive stress applied in the channel formation region of the n-channel MISFET. As a result, the driving power of the p-channel MISFET can be improved and reduction in the driving power of the n-channel MISFET can be suppressed.

Next, an interlevel insulating film 15 of, for example, a silicon oxide film is formed over the p-type substrate 1 by plasma CVD and then a surface of the interlevel insulting film 15 is flattened by CMP. Thereafter, although not shown in the drawings, a contact hole(s), a metal interconnect layer(s) and the like are formed using a known technique to complete fabrication of the semiconductor device of this embodiment.

In the seventh embodiment, the polycrystalline silicon film 6A is used as a material of the first gate electrodes 6n and 6p. However, instead of the polycrystalline silicon film 6A, some other conductive material may be used. Also, the SiGe film 16A is used as a material of the second gate electrodes 16n and 16p. However, instead of the SiGe film 16A, some other conductive material which is also different from the material of the first gate electrodes 6n and 6p may be used. Moreover, a two-layer structure of a polycrystalline silicon film and a SiGe film is used as a gate electrode structure. However, instead of the two-layer structure, a stacked layer structure in which three or more layers are stacked may be used. In such a case, a multilayer structure having a smaller height than a height of the n-channel MISFET may be used as a gate electrode structure of the p-channel MISFET.

In the seventh embodiment, the deposition thickness t2 itself of the silicon nitride film 14 can be controlled to be a thickness with which contact failure is prevented. This is the same effect as that of the first embodiment shown in FIGS. 4A through 4D.

The invention which has been devised by the inventors of the present application has been described in detail on the basis of each of the embodiments. However, needless to say, the present invention is not limited the above-described embodiments but it may be modified variously without departing from the sprits and scope of the present invention.

What is claimed is:

1. A semiconductor device comprising a first MIS transistor of a first conductive type formed in a first region in a semiconductor substrate, wherein the first MIS transistor includes
  a first gate insulating film formed on the first region,
  a first gate electrode portion formed on the first gate insulating film,
  first insulating sidewalls formed on side surfaces of the first gate electrode portion,
  first source/drain regions, each being formed in part of the first region located at a side of an associated one of the first insulating sidewalls, and
  a first stress film formed so as to cover the first gate electrode portion and the first source/drain regions,
wherein the first gate electrode portion includes a first gate electrode formed on the first gate insulating film and a first silicide layer formed on the first gate electrode,
wherein a height of an upper surface of the first silicide layer of the first gate electrode portion is lower than a height of an upper edge of each said first insulating sidewall, and
wherein a thickness of first part of the first stress film located on the first gate electrode portion is larger than a thickness of second part of the first stress film located on the first source/drain regions.

2. The semiconductor device of claim 1, wherein the first MIS transistor is an n-channel MIS transistor, and
  wherein the first stress film is a tensile stress film for generating a tensile stress in a channel region of the first region located under the first gate electrode portion.

3. The semiconductor device of claim 1, wherein the first MIS transistor is a p-channel MIS transistor, and
  wherein the first stress film is a compressive stress film for generating a compressive stress in a channel region of the first region located under the first gate electrode portion.

4. The semiconductor device of claim 1, further comprising a second MIS transistor of a second conductivity type formed on a second region in the semiconductor substrate,
  wherein the second MIS transistor includes
    a second gate insulating film formed on the second region,
    a second gate electrode portion formed on the second insulating film,
    second insulating sidewalls formed on side surfaces of the second gate electrode portion,
    second source/drain regions, each being formed in part of the second region located at a side of an associated one of the second insulating sidewalls, and
    a second stress film formed so as to cover the second gate electrode portion and the second source/drain regions.

5. The semiconductor device of claim 4, wherein a height of an upper surface of the second gate electrode portion is lower than a height of an upper edge of each said second insulating sidewall, and
  wherein a thickness of third part of the second stress film located on the second gate electrode portion is larger than a thickness of fourth part of the second stress film located on the second source/drain regions.

6. The semiconductor device of claim 4, wherein the first MIS transistor is an n-channel MIS transistor,
  wherein the second MIS transistor is a p-channel MIS transistor,
  wherein the first stress film is a tensile stress film for generating a tensile stress in a channel region of the first region located under the first gate electrode portion, and
  wherein the second stress film is formed of the tensile stress film forming the first stress film.

7. The semiconductor device of claim 4, wherein the first MIS transistor is a p-channel MIS transistor,
  wherein the second MIS transistor is an n-channel MIS transistor,
  wherein the first stress film is a compressive stress film for generating a compressive stress in a channel region of the first region located under the first gate electrode portion, and
  wherein the second stress film is formed of the compressive stress film forming the first stress film.

8. The semiconductor device of claim 4, wherein the first MIS transistor is an n-channel MIS transistor,
  wherein the second MIS transistor is a p-channel MIS transistor,
  wherein the first stress film is a tensile stress film for generating a tensile stress in a channel region of the first region located under the first gate electrode portion, and
  wherein the second stress film is a compressive stress film for generating a compressive stress in a channel region of the second region located under the second gate electrode portion.

9. The semiconductor device of claim 4, wherein the second gate electrode portion includes a second gate electrode formed on the second gate insulating film and a second silicide layer formed on the second gate electrode.

10. The semiconductor device of claim 4, wherein a height of an upper surface of the second gate electrode portion is equal to or larger than a height of an upper edge of each said second insulating sidewall, and
  wherein a thickness of first part of the first stress film located on the first gate electrode portion is larger than a thickness of third part of the second stress film located on the second gate electrode portion.

11. The semiconductor device of claim 10, wherein a height of an upper edge of each said first insulating sidewall is larger than the height of the upper edge of each said second insulating sidewall.

12. The semiconductor device of claim 10, wherein the first MIS transistor is an n-channel MIS transistor,
  wherein the second MIS transistor is a p-channel MIS transistor,
  wherein the first stress film is a tensile stress film for generating a tensile stress in a channel region of the first region located under the first gate electrode portion, and
  wherein the second stress film is formed of the tensile stress film forming the first stress film.

13. The semiconductor device of claim 10, wherein the first MIS transistor is a p-channel MIS transistor,
  wherein the second MIS transistor is an n-channel MIS transistor,
  wherein the first stress film is a compressive stress film for generating a compressive stress in a channel region of the first region located under the first gate electrode portion, and
  wherein the second stress film is formed of the compressive stress film forming the first stress film.

14. The semiconductor device of claim 10, wherein the second gate electrode portion includes a second gate electrode formed on the second gate insulating film and a second silicide layer formed on the second gate electrode.

15. The semiconductor device of claim 10, wherein a height of an upper edge of each said first insulating sidewall is equal to the height of the upper edge of each said second insulating sidewall.

16. The semiconductor device of claim 15, wherein the first MIS transistor is an n-channel MIS transistor, wherein the second MIS transistor is a p-channel MIS transistor, wherein the first stress film is a tensile stress film for generating a tensile stress in a channel region of the first region located under the first gate electrode portion, and wherein the second stress film is formed of the tensile stress film forming the first stress film.

17. The semiconductor device of claim 15, wherein the first MIS transistor is a p-channel MIS transistor, wherein the second MIS transistor is an n-channel MIS transistor, wherein the first stress film is a compressive stress film for generating a compressive stress in a channel region of the first region located under the first gate electrode portion, and wherein the second stress film is formed of the compressive stress film forming the first stress film.

18. The semiconductor device of claim 10, wherein the second gate electrode portion includes a second gate electrode formed on the second gate insulating film, a third gate electrode formed of a different conductive material from a material of the second electrode on the second gate electrode, and a third silicide layer formed on the third gate electrode.

19. The semiconductor device of claim 18, wherein the second gate electrode is formed of silicon, and the third gate electrode is formed of a SiGe film.

* * * * *